United States Patent
Nozawa et al.

(10) Patent No.: US 10,915,016 B2
(45) Date of Patent: Feb. 9, 2021

(54) MASK BLANK, METHOD FOR MANUFACTURING PHASE SHIFT MASK, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Ryo Ohkubo, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 175 days.

(21) Appl. No.: 15/769,116

(22) PCT Filed: Oct. 26, 2016

(86) PCT No.: PCT/JP2016/081710
§ 371 (c)(1),
(2) Date: Apr. 18, 2018

(87) PCT Pub. No.: WO2017/077915
PCT Pub. Date: May 11, 2017

(65) Prior Publication Data
US 2018/0299767 A1 Oct. 18, 2018

(30) Foreign Application Priority Data
Nov. 6, 2015 (JP) .................. 2015-218455

(51) Int. Cl.
G03F 1/32 (2012.01)
G03F 1/54 (2012.01)
G03F 1/80 (2012.01)
G03F 1/26 (2012.01)
G03F 1/38 (2012.01)
G03F 7/20 (2006.01)
H01L 21/033 (2006.01)

(52) U.S. Cl.
CPC .................. *G03F 1/32* (2013.01); *G03F 1/26* (2013.01); *G03F 1/38* (2013.01); *G03F 1/54* (2013.01); *G03F 1/80* (2013.01); *G03F 7/20* (2013.01); *H01L 21/0337* (2013.01)

(58) Field of Classification Search
CPC ................. G03F 1/32; G03F 1/26; G03F 1/54
See application file for complete search history.

(56) References Cited

U.S. PATENT DOCUMENTS

| 5,230,971 | A | 7/1993 | Alpay |
| 6,503,669 | B2 | 1/2003 | Kaneko et al. |
| 2001/0044054 | A1 | 11/2001 | Kaneko et al. |
| 2003/0219654 | A1 | 11/2003 | Ushida et al. |
| 2005/0019674 | A1 | 1/2005 | Okubo et al. |
| 2005/0217988 | A1 | 10/2005 | Yoshikawa et al. |
| 2007/0212618 | A1* | 9/2007 | Yoshikawa ............... G03F 1/32 430/5 |
| 2010/0081066 | A1 | 4/2010 | Nozawa |
| 2011/0229807 | A1 | 9/2011 | Hashimoto et al. |
| 2012/0064438 | A1 | 3/2012 | Yoshikawa et al. |
| 2012/0189946 | A1 | 7/2012 | Hashimoto et al. |
| 2013/0273738 | A1 | 10/2013 | Sakai et al. |
| 2015/0338731 | A1 | 11/2015 | Nozawa et al. |
| 2016/0054650 | A1* | 2/2016 | Nam .................. G03F 1/26 430/5 |
| 2018/0299767 | A1 | 10/2018 | Nozawa et al. |

FOREIGN PATENT DOCUMENTS

| JP | 2001033940 A | 2/2001 |
| JP | 2001-305713 A | 11/2001 |
| JP | 2002-287330 A | 10/2002 |
| JP | 2003-248298 A | 9/2003 |
| JP | 2003322954 A | 11/2003 |
| JP | 2004053662 A | 2/2004 |
| JP | 2005284216 A | 10/2005 |
| JP | 2009-080510 A | 4/2009 |
| JP | 2014137388 A | 7/2014 |
| JP | 2014197215 A | 10/2014 |
| JP | 2014-232191 A | 12/2014 |
| JP | 2015-156036 A | 8/2015 |
| JP | 2016188958 A | 11/2016 |
| WO | 2004/090635 A1 | 10/2004 |

OTHER PUBLICATIONS

International Search Report of PCT/JP2016/081710 dated Jan. 17, 2017.

* cited by examiner

*Primary Examiner* — Daborah Chacko-Davis
(74) *Attorney, Agent, or Firm* — Kilpatrick Townsend & Stockton LLP

(57) ABSTRACT

Provided is a mask blank (100) for manufacturing a phase shift mask.
The mask blank (100) in which a phase shift film (2) made of a material containing silicon, a light shielding film (3) made of a material containing chromium, oxygen, and carbon, and a hard mask film (4) made of a material containing one or more elements selected from silicon and tantalum are provided in this order on a transparent substrate (1) is characterized in that the light shielding film (3) is a single layer film having a composition gradient portion with an increased oxygen content at a surface on the hard mask film (4) side and in a region close thereto, the light shielding film (3) has a maximum peak of N1s narrow spectrum obtained by analysis of X-ray photoelectron spectroscopy of lower detection limit or less, and a part of the light shielding film (3) excluding the composition gradient portion has a chromium content of 50 atom % or more and has a maximum peak of Cr2p narrow spectrum obtained by analysis of X-ray photoelectron spectroscopy at binding energy of 574 eV or less.

20 Claims, 10 Drawing Sheets

[Fig. 1]
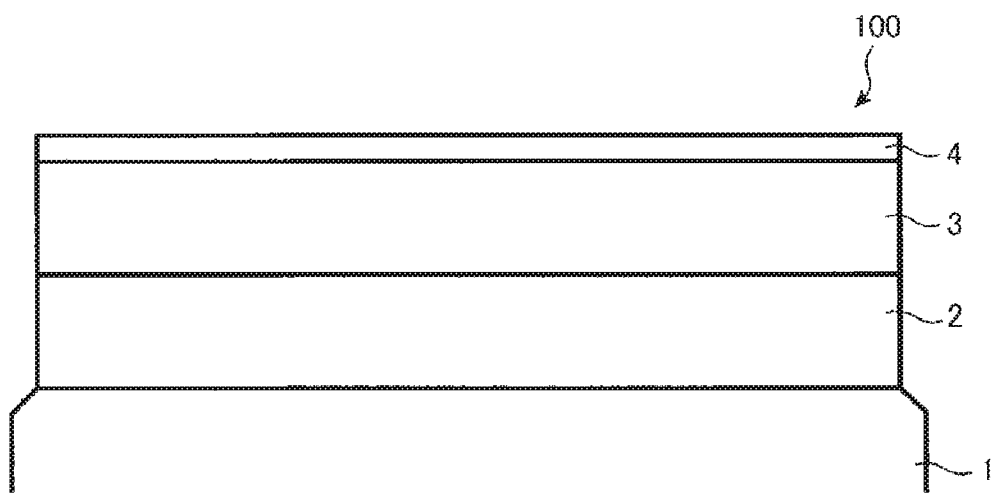

[Fig. 2(a)] 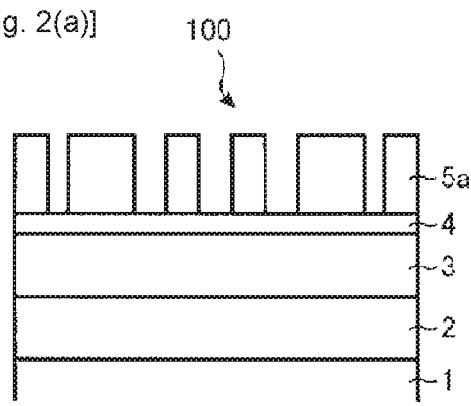
[Fig. 2(e)] 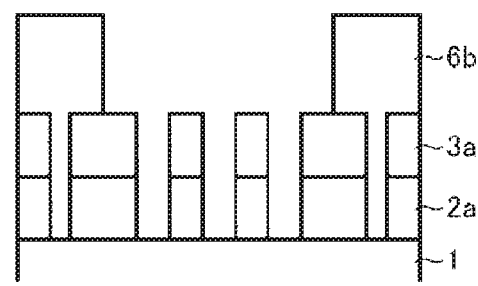
[Fig. 2(b)] 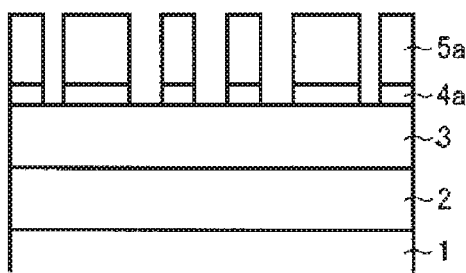
[Fig. 2(f)] 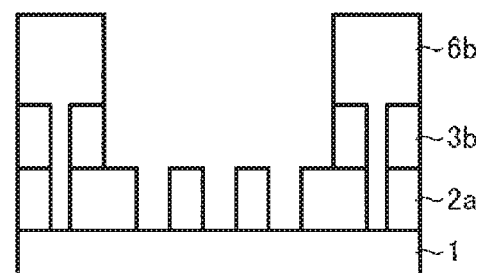
[Fig. 2(c)] 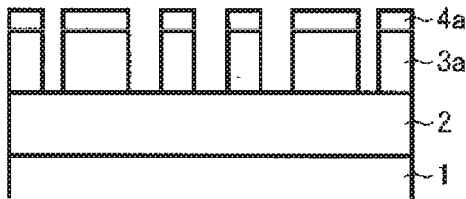
[Fig. 2(g)] 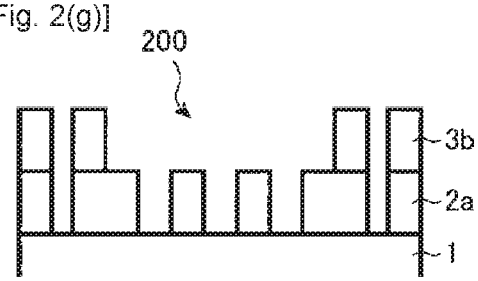
[Fig. 2(d)] 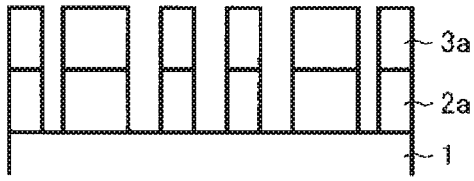

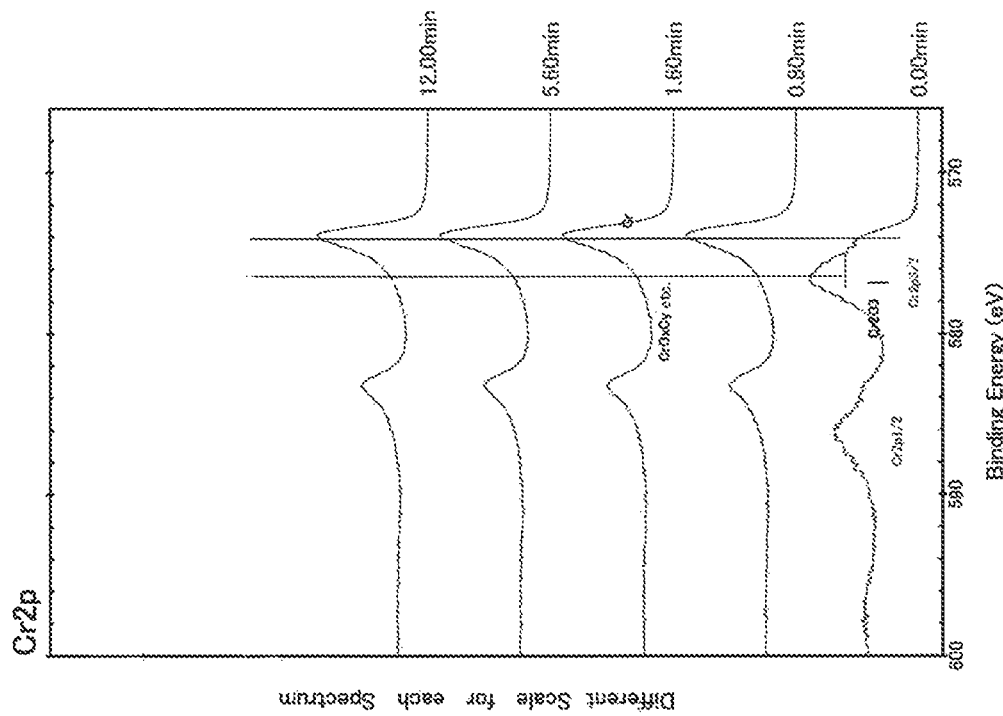
[Fig. 3]
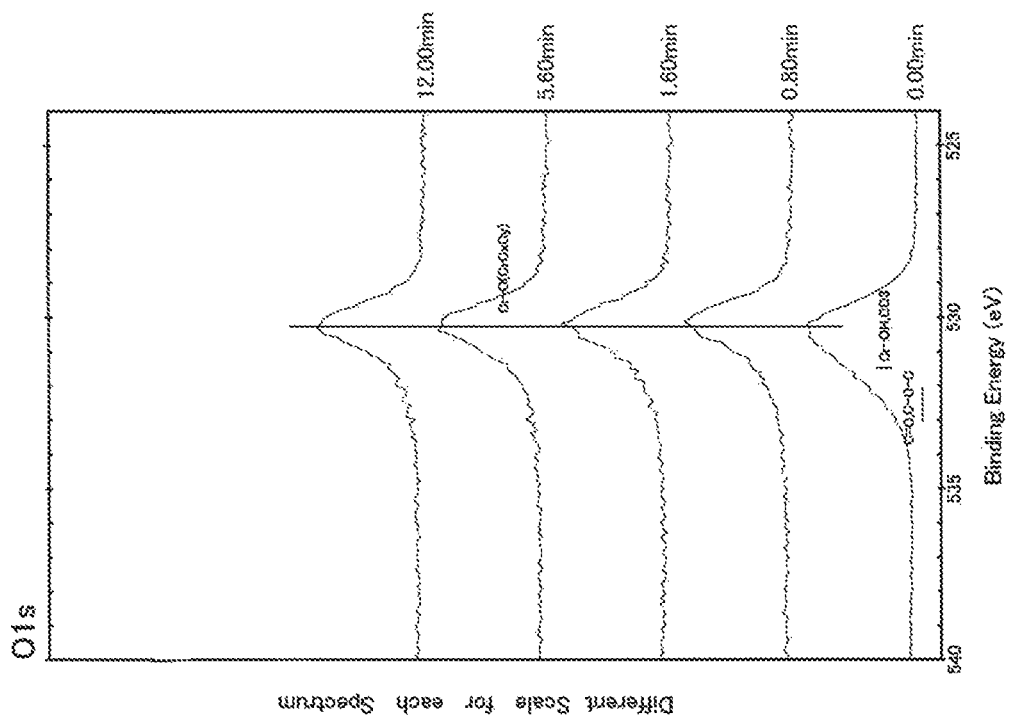
[Fig. 4]

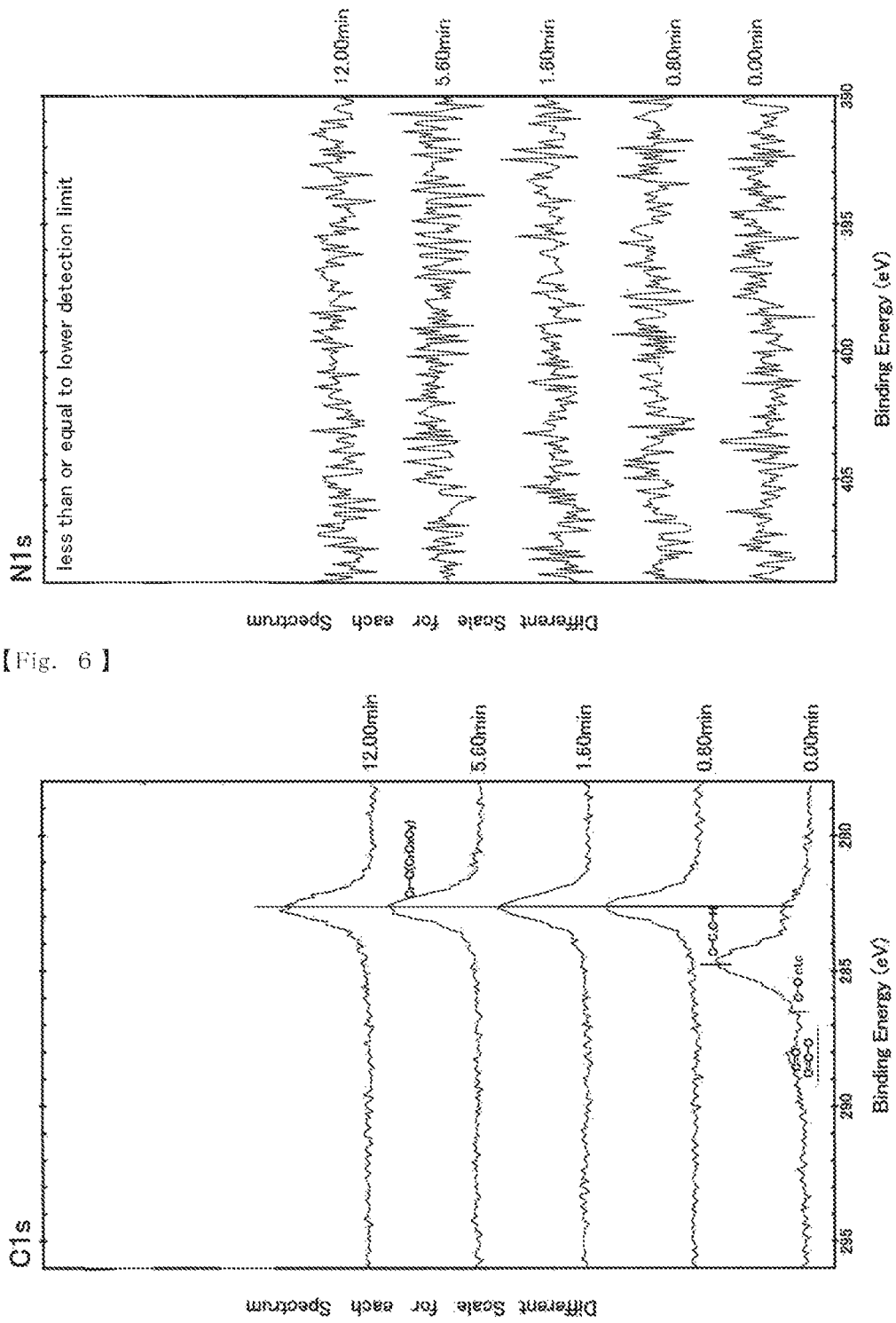

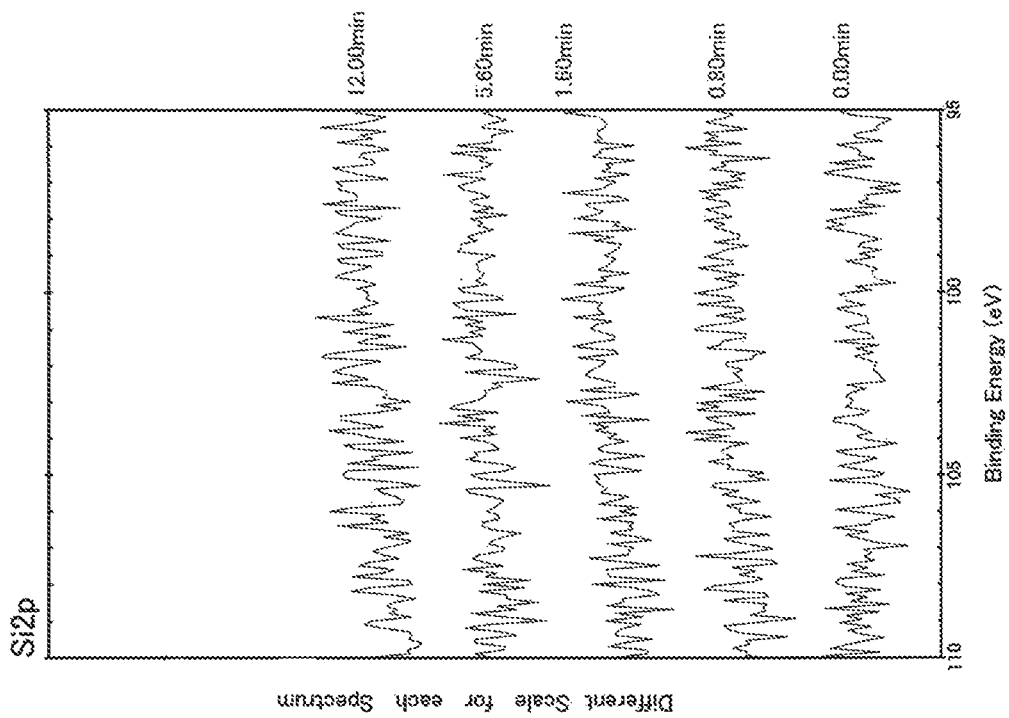
[Fig. 7]
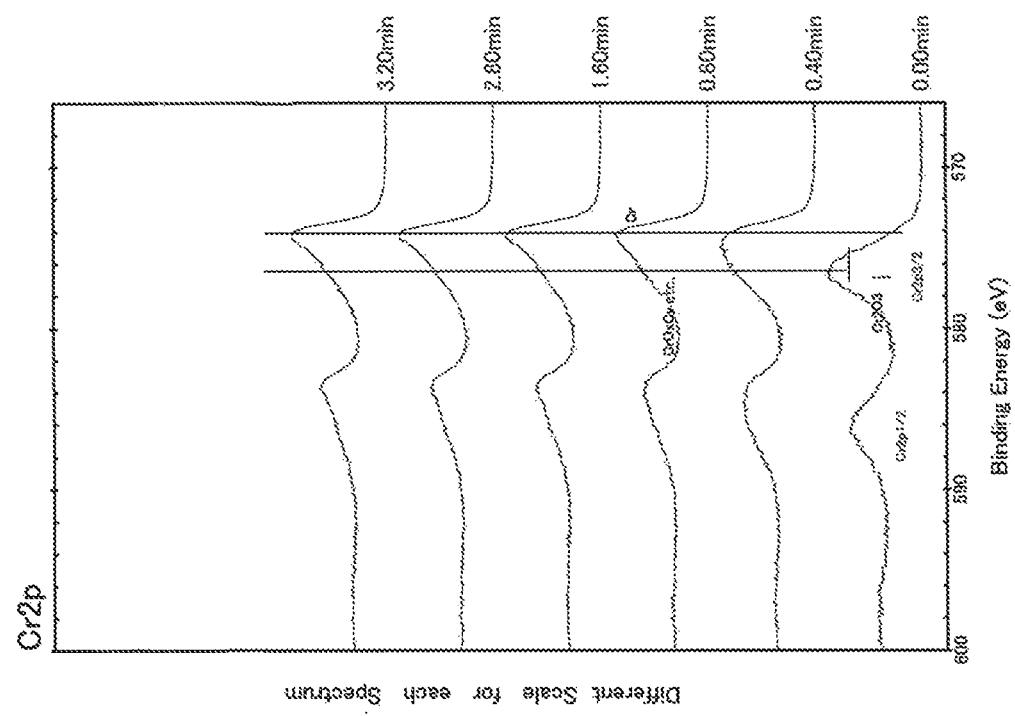
[Fig. 8]

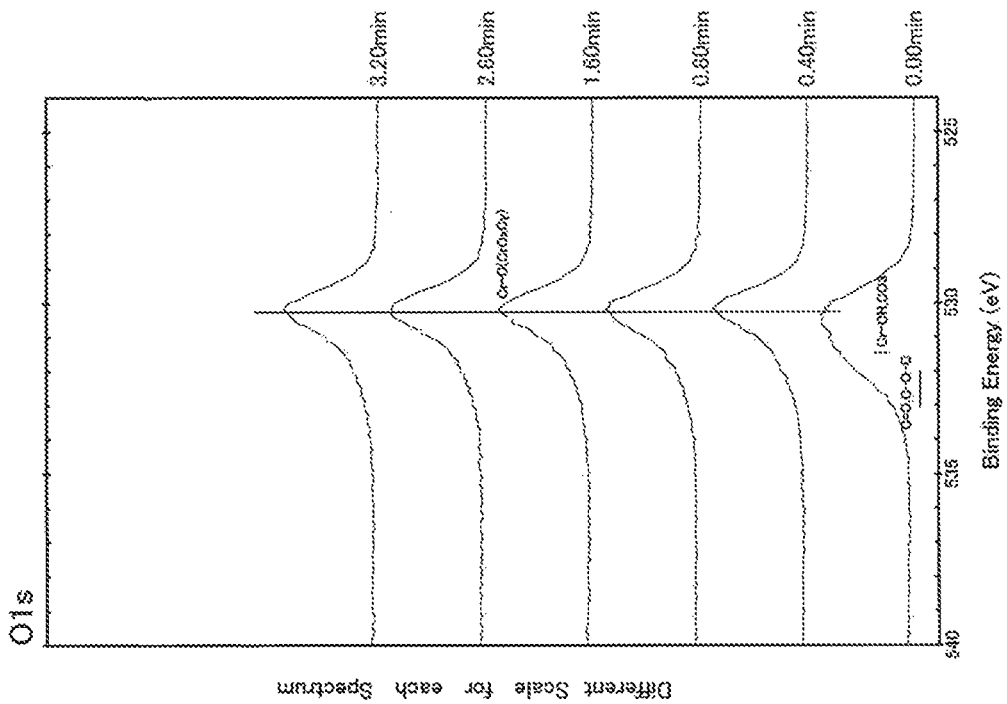

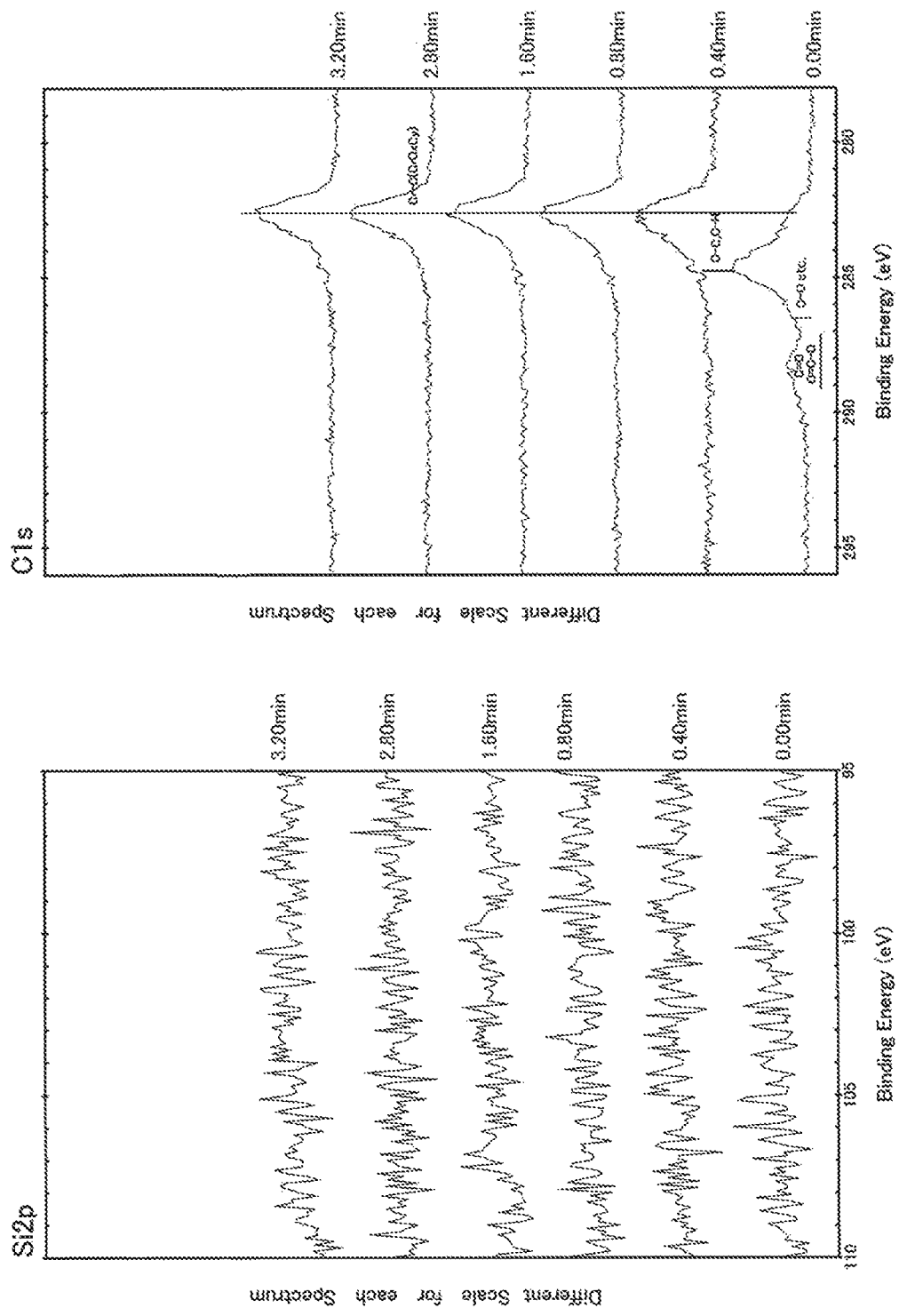

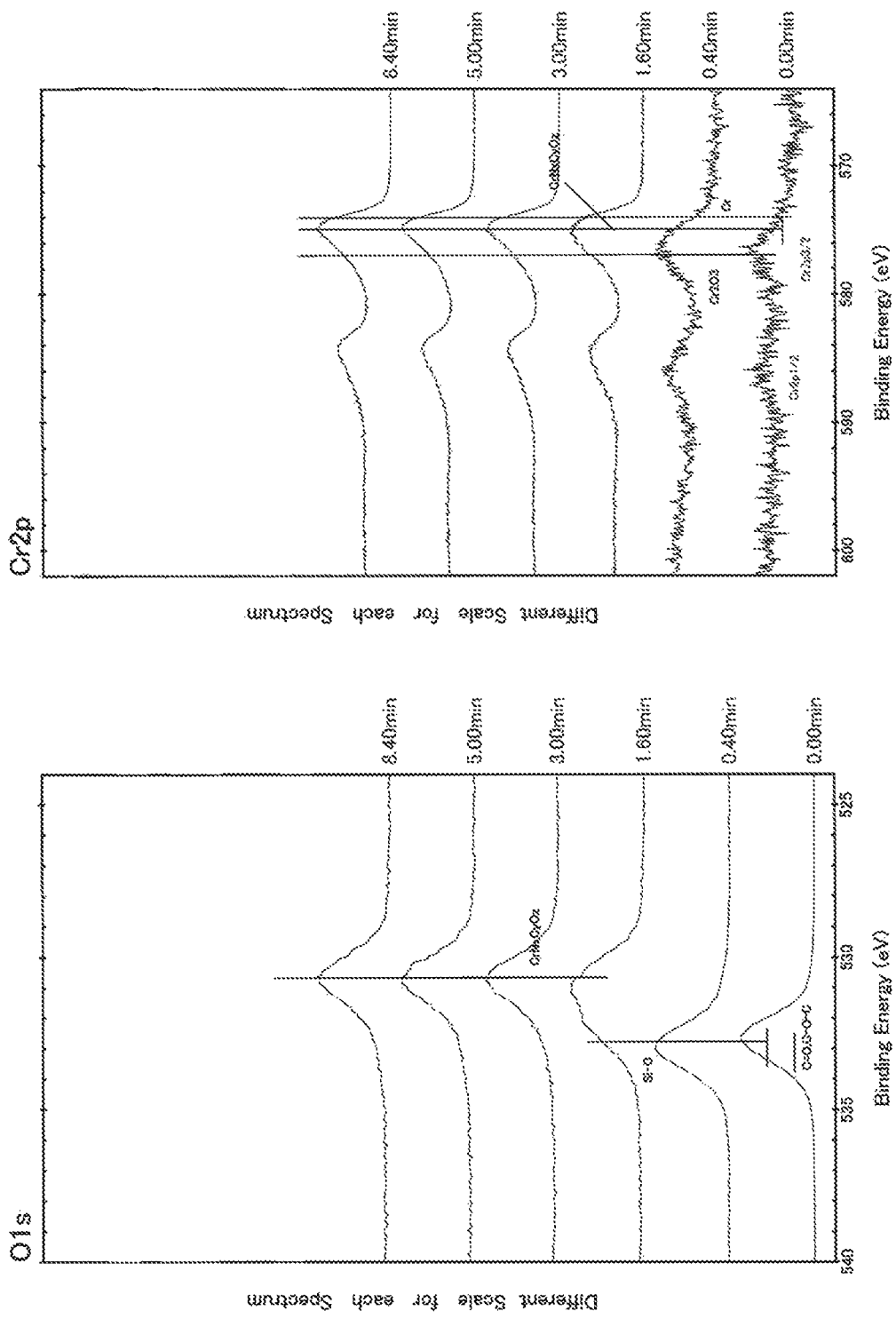

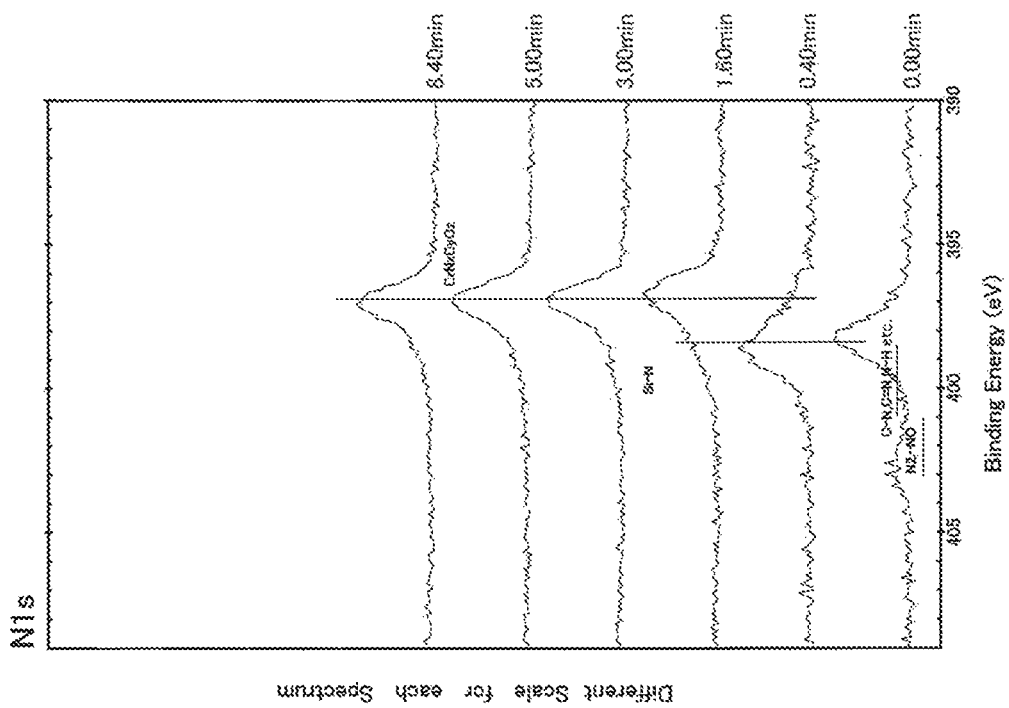
[Fig. 15]
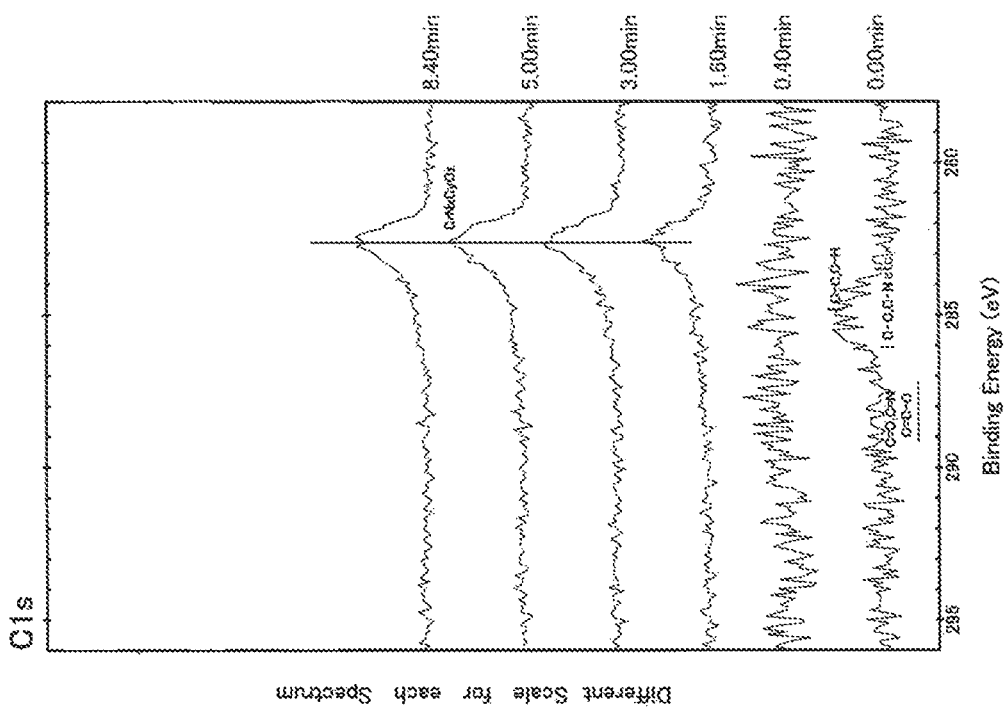
[Fig. 16]

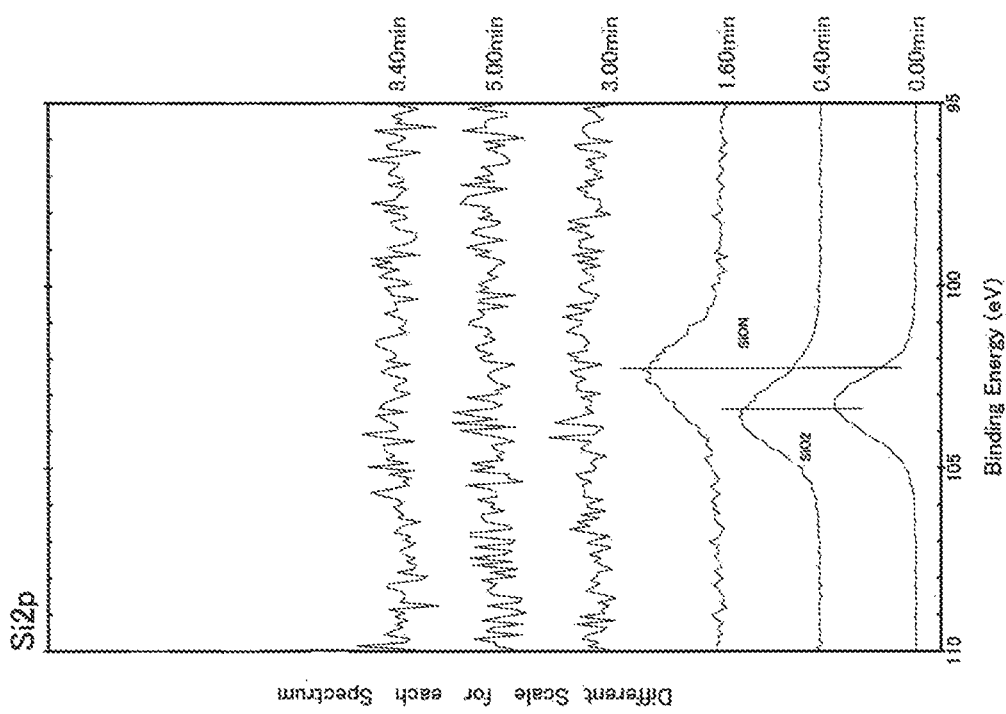
[Fig. 17]

MASK BLANK, METHOD FOR MANUFACTURING PHASE SHIFT MASK, AND METHOD FOR MANUFACTURING SEMICONDUCTOR DEVICE

CROSS REFERENCE TO RELATED APPLICATIONS

This application is a National Stage of International Application No. PCT/JP2016/081710 filed Oct. 26, 2016, claiming priority based on Japanese Patent Application No. 2015-218455 filed Nov. 6, 2015.

TECHNICAL FIELD

This invention relates to a mask blank for a phase shift mask, a method for manufacturing a phase shift mask using the mask blank, and a method for manufacturing a semiconductor device using the phase shift mask manufactured from the mask blank.

BACKGROUND

As a mask blank for a half tone phase shift mask, a mask blank having a structure where a half tone phase shift film including a metal silicide-based material, a light shielding film including a chromium-based material, and an etching mask film (hard mask film) including an inorganic material are laminated on a transparent substrate has been known (e.g., see Publication 1). In the case of manufacturing a phase shift mask using this mask blank, initially, an etching mask film is patterned through dry etching by fluorine-based gas with a resist pattern formed on a surface of the mask blank as a mask, subsequently a light shielding film is patterned through dry etching by a mixed gas of chlorine and oxygen with an etching mask film as a mask, and further, the phase shift film is patterned through dry etching by fluorine-based gas with a pattern of the light shielding film as a mask.

On the other hand, as a mask blank using a chromium-based material, use of a multi-layer film including a combination of CrOC and CrOCN is suggested as a light shielding film and an anti-reflective film (e.g., see Publication 2).

PRIOR ART PUBLICATIONS

Patent Publications

Publication 1:
International Publication WO 2004/090635
Publication 2:
Japanese Patent Application Publication 2001-305713

SUMMARY OF INVENTION

Problem to be Solved by the Invention

In a mask blank as described in Publication 1, it is required for a light shielding film including a chromium-based compound to be provided with light-shielding performance that reduces an exposure light transmitted through a phase shift film at or below a predetermined light amount. In manufacturing a phase shift mask from this mask blank, a pattern including a light shielding band is formed on the light shielding film. A predetermined optical density is desired to be satisfied by a laminated structure of the phase shift film and the light shielding film. At the same time, the light shielding film is desired to function as an etching mask in patterning the phase shift film through dry etching of fluorine-based gas to form a phase shift pattern. At the finishing stage of the phase shift mask, a rather sparse pattern such as a light shielding pattern is generally formed on the light shielding film. However, during forming a phase shift mask from a mask blank, a light shielding film should function as an etching mask in forming a phase shift pattern, which is a fine transfer pattern, on the phase shift film. Therefore, it is preferable that a fine pattern can also be formed at high dimension accuracy on the light shielding film.

In dry etching of a light shielding film made of a chromium-based material, a mixed gas of chlorine-based gas and oxygen gas (oxygen-containing chlorine-based gas) is used as an etching gas. Generally, dry etching using oxygen-containing chlorine-based gas as an etching gas has low tendency in anisotropic etching, and high tendency in isotropic etching.

Generally, in forming a pattern on a thin film through dry etching, etching advances not only in thickness direction of the film but also in side wall direction of the pattern formed on the thin film, which is so-called side etching. To suppress advancement of the side etching, it has been done in dry etching to apply bias voltage from an opposite side of a main surface on which a thin film of a substrate is formed, and to control so that more etching gas contacts in thickness direction of the film. In the case of ion-based dry etching using an etching gas that is likely to form an ionic plasma as fluorine-based gas, since applying bias voltage causes better controllability in etching direction and can enhance anisotropic property of etching, amount of side etching in the thin film to be etched can be minimized.

On the other hand, in the case of dry etching by oxygen-containing chlorine-based gas, since oxygen gas tends to form radical plasma, control of etching direction by applying bias voltage is less effective so that enhancing anisotropic property of etching is difficult. Therefore, amount of side etching tends to increase in the case of forming a pattern on a light shielding film made of a chromium-based material through dry etching using oxygen-containing chlorine-based gas.

In the case of patterning a light shielding film of a chromium-based material through dry etching using oxygen-containing chlorine-based gas with a resist pattern made of an organic-based material as an etching mask, the resist pattern is etched and decreased from the upper portion. In this circumstance, side wall direction of the pattern is also etched and decreased. Therefore, width of the pattern to be formed on a resist film is designed beforehand allowing for the decrease amount due to side etching. Moreover, width of the pattern to be formed on the resist film is designed allowing for the side etching amount of the light shielding film of a chromium-based material.

In recent years, a mask blank provided with a hard mask film made of materials having sufficient etching selectivity between a chromium-based material on a light shielding film of chromium-based material is beginning to be used relative to dry etching using oxygen-containing chlorine-based gas. In this mask blank, a pattern is formed on a hard mask film through dry etching using a resist pattern as a mask. Subsequently, a light shielding film is subjected to dry etching of oxygen-containing chlorine-based gas with the hard mask film having a pattern as a mask to form a pattern on the light shielding film. This hard mask film is generally made of a material that can be patterned through dry etching of fluorine-based gas. Dry etching of fluorine-based gas is ion-based etching, having more tendency of anisotropic etching. Therefore, the pattern side wall of the hard mask film to which a phase shift pattern is formed has less amount of side etching. Further, in the case of dry etching of fluorine-based gas, side etching amount tends to decrease also in a resist pattern for forming a pattern on the hard mask film. Therefore, demand has been growing for less side etching amount in dry etching of oxygen-containing chlorine-based gas for a light shielding film of chromium-based material as well.

As means for solving the problem in side etching of a light shielding film of a chromium-based material, study is being made to significantly enhance mixing ratio of chlorine-based gas in oxygen-containing chlorine-based gas in dry etching of oxygen-containing chlorine-based gas. This is because chlorine-based gas has high tendency to turn into ionic plasma. In dry etching using oxygen-containing chlorine-based gas with higher ratio of chlorine-based gas, decrease of etching rate of a light shielding film of a chromium-based material is inevitable. To compensate for the decrease of etching rate of the light shielding film of a chromium-based material, study has been made to significantly increase bias voltage applied upon dry etching (dry etching using oxygen-containing chlorine-based gas with increased ratio of chlorine-based gas and carried out under application of high bias voltage is hereinafter to be referred to as "high-bias etching of oxygen-containing chlorine-based gas").

The etching rate of the light shielding film of a chromium-based material by high-bias etching of oxygen-containing chlorine-based gas is at a comparable level to dry etching under conventional etching conditions. The amount of side etching of the light shielding film that generates upon etching can be decreased than before. However, due to demands for further miniaturization of a pattern to be formed on a phase shift film, further decrease in side etching amount of a chromium-based light shielding film upon dry etching by oxygen-containing chlorine-based gas is becoming necessary, so that simply increasing bias voltage is insufficient.

For solving the above-mentioned problem, this invention provides a mask blank having a structure where a phase shift film made of a material containing silicon, a light shielding film made of a material containing chromium, and a hard mask film are laminated in this order on a transparent substrate, in which when the light shielding film is patterned with the hard mask film as a mask using oxygen-containing chlorine-based gas as an etching gas, and under high-bias etching conditions, side etching amount of the formed light shielding film pattern is significantly reduced. Moreover, this invention provides a method of manufacturing a phase shift mask in which by using the mask blank, a precise, fine pattern can be formed on a phase shift film. In addition, this invention provides a method of manufacturing a semiconductor device using the phase shift mask.

Means for Solving the Problem

This invention includes the following structures as means for solving the above-mentioned problem.
(Structure 1)
A mask blank having a structure in which a phase shift film, a light shielding film, and a hard mask film are laminated in this order on a transparent substrate,
in which the phase shift film is made of a material containing silicon,
in which the hard mask film is made of a material containing one or more elements selected from silicon and tantalum,
in which the light shielding film is a single layer film having a composition gradient portion with increased oxygen content on a surface at a side of the hard mask film and a region close thereto,
in which the light shielding film is made of a material containing chromium, oxygen, and carbon,
in which a part of the light shielding film excluding the composition gradient portion has chromium content of 50 atom % or more,
in which the light shielding film has a maximum peak of N1s narrow spectrum, obtained by analysis of X-ray photoelectron spectroscopy, of lower detection limit or less, and
in which the part of the light shielding film excluding the composition gradient portion has a maximum peak of Cr2p narrow spectrum, obtained by analysis of X-ray photoelectron spectroscopy, at binding energy of 574 eV or less.
(Structure 2)
The mask blank according to Structure 1, in which ratio of carbon content[atom %] divided by total content[atom %] of chromium, carbon, and oxygen of the part of the light shielding film excluding the composition gradient portion is 0.1 or more.
(Structure 3)
The mask blank according to Structure 1 or 2, in which the composition gradient portion of the light shielding film has a maximum peak of Cr2p narrow spectrum obtained by analysis of X-ray photoelectron spectroscopy at binding energy of 576 eV or more.
(Structure 4)
The mask blank according to any one of Structures 1 to 3, in which the light shielding film has a maximum peak of Si2p narrow spectrum obtained by analysis of X-ray photoelectron spectroscopy of lower detection limit or less.
(Structure 5)
The mask blank according to any one of Structures 1 to 4, in which the part of the light shielding film excluding the composition gradient portion has chromium content of 80 atom % or less.
(Structure 6)
The mask blank according to any one of Structures 1 to 5, in which the part of the light shielding film excluding the composition gradient portion has carbon content of 10 atom % or more and 20 atom % or less.
(Structure 7)
The mask blank according to any one of Structures 1 to 6, in which the part of the light shielding film excluding the composition gradient portion has oxygen content of 10 atom % or more and 35 atom % or less.
(Structure 8)
The mask blank according to any one of Structures 1 to 7, in which the part of the light shielding film excluding the composition gradient portion has difference in content of each constituent element in thickness direction that is less than 10 atom %.
(Structure 9)
The mask blank according to any one of Structures 1 to 8, in which the light shielding film has an optical density of a laminated structure of the phase shift film to an ArF excimer laser exposure light of greater than 2.0.
(Structure 10)
The mask blank according to any one of Structures 1 to 9, in which the light shielding film has a thickness of 60 nm or less.
(Structure 11)
A method of manufacturing a phase shift mask using the mask blank according to any one of Structures 1 to 10, including the steps of:

forming a phase shift pattern on the hard mask film through dry etching using fluorine-based gas with a resist film having a phase shift pattern formed on the hard mask film as a mask;

forming a phase shift pattern on a light shielding film through dry etching using a mixed gas of chlorine-based gas and oxygen gas with the hard mask film having the phase shift pattern formed thereon as a mask;

forming a phase shift pattern on the phase shift film through dry etching using fluorine-based gas with the light shielding film having the phase shift pattern formed thereon as a mask; and forming a light shielding pattern on the light shielding film through dry etching using a mixed gas of chlorine-based gas and oxygen gas with a resist film having the light shielding pattern formed on the light shielding film as a mask.

(Structure 12)

A method of manufacturing a semiconductor device including the step of exposure-transferring a transfer pattern on a resist film on a semiconductor substrate using the phase shift mask of Structure 11.

Effect of Invention

According to the mask blank of this invention including the above structures, in a mask blank having a structure where a phase shift film made of a material containing silicon, a light shielding film made of a material containing chromium, and a hard mask film are laminated in this order on a transparent substrate, even if the light shielding film was patterned through dry etching using oxygen-containing chlorine-based gas as an etching gas and under high-bias etching condition, side etching amount of the pattern of the light shielding film formed thereby can be significantly reduced. Further, when a phase shift film was patterned through dry etching using the pattern of the light shielding film to be formed as an etching mask, a highly precise, fine pattern can be formed. Therefore, a phase shift mask having highly precise and fine phase shift pattern can be obtained. Moreover, in manufacturing a semiconductor device using the phase shift mask, a pattern can be transferred on a resist film, etc. on the semiconductor device with excellent precision.

BRIEF DESCRIPTION OF THE DRAWINGS

FIG. 1 is a schematic cross-sectional view of an embodiment of the mask blank. FIGS. 2(a)-2(g)

FIGS. 2(a)-2(g) are schematic cross-sectional views showing a manufacturing step of a phase shift mask.

FIG. 3 shows a result (Cr2p narrow spectrum) where the light shielding film of the mask blank of Example 1 was subjected to XPS analysis (depth direction chemical bonding condition analysis).

FIG. 4 shows a result (O1s narrow spectrum) where the light shielding film of the mask blank of Example 1 was subjected to XPS analysis (depth direction chemical bonding condition analysis).

FIG. 5 shows a result (N1s narrow spectrum) where the light shielding film of the mask blank of Example 1 was subjected to XPS analysis (depth direction chemical bonding condition analysis).

FIG. 6 shows a result (C1s narrow spectrum) where the light shielding film of the mask blank of Example 1 was subjected to XPS analysis (depth direction chemical bonding condition analysis).

FIG. 7 shows a result (Si2p narrow spectrum) where the light shielding film of the mask blank of Example 1 was subjected to XPS analysis (depth direction chemical bonding condition analysis).

FIG. 8 shows a result (Cr2p narrow spectrum) where the light shielding film of the mask blank of Example 2 was subjected to XPS analysis (depth direction chemical bonding condition analysis).

FIG. 9 shows a result (O1s narrow spectrum) where the light shielding film of the mask blank of Example 2 was subjected to XPS analysis (depth direction chemical bonding condition analysis).

FIG. 10 shows a result (N1s narrow spectrum) where the light shielding film of the mask blank of Example 2 was subjected to XPS analysis (depth direction chemical bonding condition analysis).

FIG. 11 shows a result (C1s narrow spectrum) where the light shielding film of the mask blank of Example 2 was subjected to XPS analysis (depth direction chemical bonding condition analysis).

FIG. 12 shows a result (Si2p narrow spectrum) where the light shielding film of the mask blank of Example 2 was subjected to XPS analysis (depth direction chemical bonding condition analysis).

FIG. 13 shows a result (Cr2p narrow spectrum) where the light shielding film of the mask blank of Comparative Example 1 was subjected to XPS analysis (depth direction chemical bonding condition analysis).

FIG. 14 shows a result (O1s narrow spectrum) where the light shielding film of the mask blank of Comparative Example 1 was subjected to XPS analysis (depth direction chemical bonding condition analysis).

FIG. 15 shows a result (N1s narrow spectrum) where the light shielding film of the mask blank of Comparative Example 1 was subjected to XPS analysis (depth direction chemical bonding condition analysis).

FIG. 16 shows a result (C1s narrow spectrum) where the light shielding film of the mask blank of Comparative Example 1 was subjected to XPS analysis (depth direction chemical bonding condition analysis).

FIG. 17 shows a result (Si2p narrow spectrum) where the light shielding film of the mask blank of Comparative Example 1 was subjected to XPS analysis (depth direction chemical bonding condition analysis).

EMBODIMENTS OF THE INVENTION

The embodiments of this invention are explained below. First, the background of this invention is explained. As chromium (Cr)-based materials constructing conventional mask blanks, materials containing nitrogen (N) such as CrON and CrOCN are known. This is because defect quality of a chromium-based material film is enhanced by using nitrogen gas in addition to oxygen-containing gas as a reactive gas when forming a chromium-based material film by sputtering method. Further, by combining nitrogen in a chromium-based material film, etching rate of dry etching by oxygen-containing chlorine-based gas increases. On the other hand, a film-forming method where presputtering is carried out upon forming a film of a Cr-based material is being done in a chromium-based material film. Since this presputtering can enhance defect quality of a chromium-based material film, film-forming without the use of $N_2$ gas for enhancing defect quality is possible.

As mentioned above, in dry etching a chromium-based material film by high-bias etching, etching rate in film thickness direction can be increased significantly compared to dry etching using the same etching gas condition under normal bias voltage (hereinafter referred to as "dry etching of normal condition"). Normally, in dry etching of a thin film, both of chemical reaction etching and physical action etching are carried out. Chemical reaction etching is carried out through a process where etching gas in plasma state contacts a surface of the thin film and bonds to metal elements in the thin film to produce a compound of a low boiling point for sublimation. In chemical reaction etching, bonding of metal elements in bonding condition with other elements is broken to produce a compound with a low boiling point. On the contrary, physical etching is carried out through a process where ionic plasma in etching gas accelerated by bias voltage collides upon the surface of a thin film (a phenomena referred to as "ion bombardment"), so as to physically eject away each element including metal elements on the surface of the thin film (at which bond between elements is broken), and a compound of low boiling point is produced with the metal elements for sublimation.

High-bias etching is an etching where dry etching by physical action is enhanced compared to dry etching of a normal condition. Physical action etching contributes significantly to etching in film thickness direction, but contributes less to etching in side wall direction of a pattern. On the contrary, chemical reaction etching contributes to both etching in film thickness direction and etching in side wall direction of a pattern. Therefore, to reduce side etching amount than before, it is necessary to reduce easiness of being etched by chemical reaction in a light shielding film of a chromium-based material than before, as well as maintaining easiness in dry etching by physical action at a same level as conventional.

The simplest approach to reduce etching amount by chemical reaction etching of a light shielding film of a chromium-based material is to increase chromium content in the light shielding film. However, forming the light shielding film only from chromium metal causes significant reduction in etching amount of dry etching by physical action. Even in the case of dry etching by physical action, unless the chromium element ejected out from the film bonds with chlorine and oxygen to form chromyl chloride ($CrO_2Cl_2$: compound of chromium with low boiling point), chromium elements re-attach to the light shielding film and cannot be removed. Since there is limitation to increase supply of etching gas, an excess amount of chromium content in the light shielding film causes significant reduction in etching rate of the light shielding film.

Significant reduction of etching rate of a light shielding film causes significant increase in etching time when patterning the light shielding film. Increase in etching time when patterning the light shielding film causes increase in time of which a side wall of the light shielding film is exposed to etching gas, resulting in increase of side etching amount. An approach to significantly reduce etching rate of a light shielding film such as increasing chromium content in the light shielding film does not lead to suppression of side etching amount.

Therefore, an earnest investigation was made on constituent elements in a light shielding film other than chromium. To suppress side etching amount, it is effective to include light elements that consume oxygen radical that promotes chemical reaction etching. Since the material for forming a light shielding film needs to have at least patterning characteristics, light-shielding performance, chemical resistance upon cleaning, etc. of more than a certain level, light elements that can be included in a chromium-based material forming the light shielding film for more than a certain amount are limited. Typical light elements that can be included in a chromium-based material for more than a certain amount include oxygen, nitrogen, and carbon. Combining oxygen in a chromium-based material forming a light shielding film can significantly increase etching rate in both high-bias etching and dry etching of normal condition. Although side etching is likely to advance at the same time, etching time in film thickness direction is significantly shortened so that time of which a side wall of the light shielding film is exposed to etching gas is shortened. Considering these circumstances, it is necessary to include oxygen in a chromium-based material forming a light shielding film in the case of high-bias etching.

When nitrogen is added to a chromium-based material forming a light shielding film, although not as significant as the case of including oxygen, etching rate increases in both high-bias etching and dry etching of normal condition. However, side etching is also likely to advance. Considering that side etching is more likely to advance compared to the degree of etching time in film thickness direction being shortened by including nitrogen in a chromium-based material forming a light shielding film, in the case of high-bias etching, it is considered as preferable not to include nitrogen in a chromium-based material forming a light shielding film.

In the case of dry etching of normal condition, when carbon is included in a chromium-based material forming a light shielding film, etching rate is slightly reduced compared to the case of a light shielding film formed only from chromium. However, when carbon is included in a chromium-based material forming a light shielding film, durability to physical action etching is reduced compared to the case of a light shielding film formed only from chromium. Therefore, when carbon is included in a chromium-based material forming a light shielding film in the case of high-bias etching, etching rate is increased compared to the case of a light shielding film formed only from chromium. Further, when carbon is included in a chromium-based material forming a light shielding film, since oxygen radical that promotes side etching is consumed, side etching is less likely to advance compared to the case of including oxygen or nitrogen. Considering the above, in the case of high-bias etching, it is necessary that a chromium-based material forming a light shielding film contains carbon.

Occurrence of such significant difference between the case of including nitrogen and the case of including carbon in a material forming a light shielding film is due to difference between Cr—N bond and Cr—C bond. Cr—N bond has low binding energy (bound energy) and bonding tends to disassociate easily. Therefore, contact of oxygen and chlorine in the form of plasma causes Cr—N bond to disassociate and tends to easily form chromyl chloride of low boiling point. On the contrary, Cr—C bond has high binding energy and is less likely to disassociate. Therefore, despite the contact of oxygen and chlorine in the form of plasma, it is less likely that Cr—C bond is disassociated to form chromyl chloride of low boiling point.

High-bias etching has great tendency of dry etching by physical action. While elements in a thin film are ejected out by ion bombardment in dry etching by physical action, bond between each element tends to break in such a circumstance. Therefore, difference in easiness of production of chromyl chloride that occurs due to difference in degree of binding energy between elements is smaller compared to the case of chemical reaction etching. Etching by physical action that occurs by bias voltage significantly contributes to etching in film thickness direction, but not as much in etching in side wall direction of a pattern. Therefore, in high-bias etching of a light shielding film in film thickness direction, there is less difference in easiness of etching between Cr—N bond and Cr—C bond.

On the contrary, side etching that advances in side wall direction of a light shielding film has high tendency of chemical reaction etching. Therefore, if abundance ratio of Cr—N bond is high in a material forming a light shielding film, side etching is likely to advance. On the other hand, if abundance ratio of Cr—C bond is high in a material forming a light shielding film, side etching is less likely to advance.

As a result of comprehensive consideration of the above, the following result was obtained. Namely, a light shielding film that is to be dry etched through high-bias etching using a hard mask film having a pattern formed thereon as an etching mask is a single layer film having a composition gradient portion with increased oxygen content at and near a surface at the hard mask film side, in which the light shielding film is made of a material containing chromium, oxygen, and carbon; a portion of the light shielding film excluding the composition gradient portion has chromium content of 50 atom % or more; a maximum peak of N1s narrow spectrum obtained by analysis of X-ray photoelectron spectroscopy (XPS) of the light shielding film is lower detection limit or less; and Cr2p narrow spectrum obtained by analysis of X-ray photoelectron spectroscopy of the portion of the light shielding film excluding the composition gradient portion has a maximum peak at binding energy of 574 eV or less.

Detailed structures of this invention given above are explained based on the drawings. Reference numerals applied in the drawings are used for similar components.

<Mask Blank>

FIG. 1 shows a schematic structure of an embodiment of a mask blank. A mask blank 100 shown in FIG. 1 has a structure where one main surface of a transparent substrate 1 has a phase shift film 2, a light shielding film 3, and a hard mask film 4 laminated in this order. Further, the mask blank 100 can have a structure where the hard mask film 4 has a resist film laminated thereon as desired. The detail of major structure of the mask blank 100 is explained below.

[Transparent Substrate]

The transparent substrate 1 is made of materials having good transmittance to exposure light used in an exposure step in lithography. Such materials include synthetic quartz glass, aluminosilicate glass, soda-lime glass, low thermal expansion glass ($SiO_2$—$TiO_2$ glass, etc.), and various other glass substrates can be used. Particularly, a substrate using synthetic quartz glass has high transmittance to ArF excimer laser light (wavelength: about 193 nm), which can be used preferably as the transparent substrate 1 of the mask blank 100.

The exposure step in lithography as used herein refers to an exposure step of lithography using a phase shift mask produced by using the mask blank 100, and the exposure light hereinafter means exposure light used in the exposure step. As the exposure light, any one of ArF excimer laser light (wavelength: 193 nm), KrF excimer laser light (wavelength: 248 nm), and i-line light (wavelength: 365 nm) can be applied, but in view of miniaturizing a phase shift pattern in the exposure step, it is preferable to apply ArF excimer laser light as the exposure light. Therefore, embodiments in the case where ArF excimer laser light is applied as exposure light are described below.

[Phase Shift Film]

The phase shift film 2 has a predetermined transmittance to exposure light used in an exposure transfer step, and has an optical characteristic where exposure light transmitted through the phase shift film 2 and exposure light transmitted through the atmosphere for same distance as the thickness of the phase shift film 2 have a predetermined phase difference.

The phase shift film 2 as above is deemed herein as made of a material containing silicon (Si). Further, the phase shift film 2 is preferably made of a material containing nitrogen (N), other than silicon. The phase shift film 2 as above can be patterned through dry etching using fluorine-based gas, and a material having sufficient etching selectivity to CrOC film forming the light shielding film 3 mentioned below is used.

If capable of being patterned through dry etching using fluorine-based gas, the phase shift film 2 can further contain one or more elements selected from metalloid elements, non-metallic elements, and metal elements.

Among the above, the metalloid elements can be any metalloid elements in addition to silicon. Non-metallic elements can be any non-metallic elements in addition to nitrogen, preferably containing one or more elements selected from, for example, oxygen (O), carbon (C), fluorine (F), and hydrogen (H). Metal elements include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), boron (B), and germanium (Ge).

The phase shift film 2 as mentioned above is made of, for example, MoSiN; refractive index n, extinction coefficient k, and film thickness of the phase shift film 2 are selected respectively to satisfy a predetermined phase difference (e.g., 140 [deg]~190 [deg], preferably 150 [deg]~180 [deg]) to exposure light (e.g., ArF excimer laser light) and a predetermined transmittance (e.g., 1%~30%); and composition of the film material and film forming condition of the film are adjusted to achieve the refractive index n and the extinction coefficient k.

[Light Shielding Film]

The light shielding film 3 is a film forming a light shielding pattern including a light shielding band pattern formed on the mask blank 100, having light shielding property to exposure light used in exposure step in lithography. The light shielding film 3 of a laminated structure with the phase shift film 2 is necessary to have more than 2.0, preferably 2.8 or more, and more preferably 3.0 or more optical density (OD) to, for example, ArF excimer laser light of wavelength 193 nm. Further, in an exposure step in lithography, to prevent defects in exposure transfer by reflection of exposure light, surface reflectance of exposure light is suppressed at a low rate at both main surfaces. Particularly, reflectance of a surface side of the light shielding film 3 (surface of the side that is farthest from transparent substrate 1) onto which reflected light of exposure light from an optical reduction system of an exposure apparatus hits is preferably, for example, 40% or less (preferably 30% or less). This is to suppress stray light that generates from multiple reflections between the surface of the light shielding film 3 and the optical reduction system lens.

Further, the light shielding film 3 should function as an etching mask upon dry etching by fluorine-based gas for forming a transfer pattern (phase shift pattern) on the phase shift film 2. Therefore, the light shielding film 3 should be made from materials having sufficient etching selectivity to the phase shift film 2 upon dry etching by fluorine-based gas. It is required for the light shielding film 3 to precisely form a fine pattern that is to be formed on the phase shift film 2. Film thickness of the light shielding film 3 is preferably 60 nm or less, more preferably 55 nm or less, and further preferably 50 nm or less. When the film thickness of the light shielding film 3 is too thick, the fine pattern to be formed cannot be created at a high precision. On the other hand, it is required for the light shielding film 3 to satisfy the required optical density as given above. Therefore, the film thickness of the light shielding film 3 is desired to be greater than 15 nm, preferably 20 nm or more, and further preferably 25 nm or more.

The light shielding film 3 is made of a material containing chromium (Cr), oxygen (O), and carbon (C). Further, the light shielding film 3 includes a single layer film having a composition gradient portion with increasing oxygen content on the surface at the hard mask film 4 side and region close thereto. This is caused by, in the manufacturing step, since the surface of the formed light shielding film 3 is exposed to an oxygen-containing atmosphere, a region containing an increased amount of oxygen content than other regions is formed only on the surface of the light shielding film 3. This oxygen content is highest at the surface that is exposed to the oxygen-containing atmosphere, and the oxygen content moderately decreases with the distance from the surface. Composition of the light shielding film 3 becomes substantially constant from a position away for a certain distance from the surface. The region where oxygen content varies (moderately decreases) from the surface of the light shielding film 3 is regarded as a composition gradient portion. Further, in the light shielding film 3 at regions other than the composition gradient portion, difference of content amount of each element in film thickness direction is preferably less than 10 atom %, more preferably 8 atom % or less, and further preferably 5 atom % or less. Incidentally, the composition gradient portion of the light shielding film 3 is preferably a region up to the depth of less than 5 nm from the surface, more preferably a region up to the depth of 4 nm or less, and further preferably a region up to the depth of 3 nm or less.

The portion of the light shielding film 3 excluding the composition gradient portion has chromium content of 50 atom % or more. This is for suppressing side etching that generates when patterning the light shielding film 3 through high-bias etching. On the other hand, the portion of the light shielding film 3 excluding the composition gradient portion preferably includes chromium content of 80 atom % or less. This is for securing sufficient etching rate when patterning the light shielding film 3 through high-bias etching.

A maximum peak of N1s narrow spectrum obtained by analysis of X-ray photoelectron spectroscopy of the light shielding film 3 is lower detection limit or less. If there exists a peak of N1s narrow spectrum, there should be a predetermined ratio or more of Cr—N bond in the material forming the light shielding film 3. If there exists a predetermined ratio or more of Cr—N bond in a material forming the light shielding film 3, it would be difficult to suppress advancement of side etching when patterning the light shielding film 3 through high-bias etching. Content of nitrogen (N) in the light shielding film 3 is preferably detection limit amount or less in composition analysis of X-ray photoelectron spectroscopy.

Cr2p narrow spectrum obtained by analysis of X-ray photoelectron spectroscopy of the portion of the light shielding film 3 excluding the composition gradient portion has a maximum peak at binding energy of 574 eV or less. The case of the state where Cr2p narrow spectrum of a material containing Cr has a maximum peak at binding energy higher than 574 eV, namely, the state of a chemical shift, shows a state where abundance ratio of chromium atoms bonded to other atoms (particularly nitrogen) is high. Such a chromium-based material tends to have low durability to chemical reaction-based etching, and it is difficult to suppress side etching. By forming the portion of the light shielding film 3 excluding the composition gradient portion from a chromium-based material where Cr2p narrow spectrum has a maximum peak at binding energy of 574 eV or less, advancement of side etching when patterned through high-bias etching can be suppressed.

The ratio of carbon content [atom %] of the portion of the light shielding film 3 excluding the composition gradient portion divided by total content [atom %] of chromium, carbon, and oxygen is preferably 0.1 or more, and more preferably 0.14 or more. As mentioned above, a major part of the light shielding film 3 is occupied by chromium, oxygen, and carbon. Majority of chromium in the light shielding film 3 exists in any of the form of Cr—O bond, the form of Cr—C bond, and in the form not bonded to oxygen and carbon. The Cr-based material having high ratio of carbon content [atom %] divided by total content [atom %] of chromium, carbon, and oxygen has high abundance ratio of Cr—C bond in the material, and applying such a Cr-based material to the light shielding film can suppress advancement of side etching when patterned through high-bias etching. Incidentally, ratio of content [atom %] of carbon in the portion of the light shielding film 3 excluding the composition gradient portion divided by total content [atom %] of chromium and carbon is preferably 0.14 or more, and more preferably, 0.16 or more.

The total content of chromium, oxygen, and carbon of the light shielding film 3 is preferably 95 atom % or more, and more preferably, 98 atom % or more. The light shielding film 3 is particularly preferably made of chromium, oxygen, and carbon, except for impurities that are inevitably mixed. Incidentally, the impurities that are inevitably mixed herein indicate elements that are inevitably mixed when forming the light shielding film 3 through sputtering method such as argon (Ar), helium (He), neon (Ne), krypton (Kr), xenon (Xe), and hydrogen (H). The portion of the light shielding film 3 excluding the composition gradient portion preferably has oxygen content of 10 atom % or more and 35 atom % or less. Further, the portion of the light shielding film 3 excluding the composition gradient portion preferably has carbon content of 10 atom % or more and 20 atom % or less.

It is preferable that Cr2p narrow spectrum obtained by analysis of X-ray photoelectron spectroscopy of composition gradient portion of the light shielding film 3 has a maximum peak at binding energy of 576 eV or more. Further, it is preferable that Si2p narrow spectrum obtained by analysis of X-ray photoelectron spectroscopy of light shielding film 3 has a maximum peak of lower detection limit or less. Existence of peak of Si2p narrow spectrum will show existence of predetermined ratio or more of unbonded silicon or silicon bonded to other atoms in the material forming the light shielding film 3. Such a material is not preferable, since etching rate to dry etching by oxygen-containing chlorine-based gas tends to decrease. It is preferable for the light shielding film 3 to have silicon content of 1 atom % or less, and preferably detection limit or less by composition analysis using an X-ray photoelectron spectroscopy.

The light shielding film 3 can be formed on the phase shift film 2 through reactive sputtering method using a target containing chromium. As the sputtering method, a sputtering using direct current (DC) power source (DC sputtering), or a sputtering using resonance frequency (RF) power source (RF sputtering) can be used. In addition, magnetron sputtering method and conventional method can also be used. DC sputtering is preferable for having a simple mechanism.

Magnetron sputtering method is preferable for increasing film forming rate and enhancing productivity. Incidentally, a film-forming apparatus can be an in-line type or a single-wafer type.

As a sputtering gas to be used in forming the light shielding film 3, preferable gas is one of a mixed gas of gas free of oxygen and containing carbon ($CH_4$, $C_2H_4$, $C_2H_6$, etc.), gas free of carbon and containing oxygen ($O_2$, $O_3$, etc.), and noble gas (Ar, Kr, Xe, He, Ne, etc.), and a mixed gas of gas containing carbon and oxygen ($CO_2$, CO, etc.) and noble gas, or gas containing noble gas, carbon, and oxygen and containing at least one of gas free of oxygen and containing carbon ($CH_4$, $C_2H_4$, $C_2H_6$, etc.) and gas free of carbon and containing oxygen. Particularly, it is safe to use a mixed gas of $CO_2$ and noble gas as sputtering gas, and $CO_2$ gas can be distributed uniformly through a wide range in a chamber for being less reactive than oxygen gas, thus preferable in view of forming a uniform film quality of the light shielding film 3 to be formed. As for the introduction method, the gas can be introduced separately into the chamber, or can be introduced by mixing some or all gas.

Materials of the target can include, not only a simple substance of chromium, but chromium as a major substance, and chromium including any one of oxygen and carbon, or a combination of oxygen and carbon added to chromium can be used as the target.

[Hard Mask Film]

The hard mask film 4 is provided in contact with a surface of the light shielding film 3. The hard mask film 4 is a film made of a material having etching durability to etching gas used in etching the light shielding film 3. It is sufficient for the hard mask film 4 to have film thickness that can function as an etching mask until dry etching for forming a pattern on the light shielding film 3 is completed, and is not basically subjected to limitation of optical characteristics. Therefore, the thickness of the hard mask film 4 can be significantly less than the thickness of the light shielding film 3.

The thickness of the hard mask film 4 is required to be 20 nm or less, preferably 15 nm or less, and more preferably 10 nm or less. This is because if the hard mask film 4 is too thick, a resist film, which is an etching mask in dry etching for forming a light shielding pattern on the hard mask film 4, needs to have thickness. Thickness of the hard mask film 4 is required to be 3 nm or more, and preferably 5 nm or more. This is because if the hard mask film 4 is too thin, there is a risk that the pattern of the hard mask film 4 disappears before completion of dry etching in forming a light shielding pattern on the light shielding film 3 depending on the condition of high-bias etching by oxygen-containing chlorine-based gas.

It is sufficient for the resist film of an organic-based material used as an etching mask in dry etching by fluorine-based gas for forming a pattern on the hard mask film 4 to have a film thickness that can function as an etching mask until dry etching of the hard mask film 4 is completed. Therefore, providing the hard mask film 4 can significantly reduce thickness of the resist film compared to conventional structures without the hard mask film 4.

The hard mask film 4 is preferably made of a material containing one or more elements selected from silicon and tantalum. In the case of forming the hard mask film 4 from a material containing silicon, it is preferable to apply $SiO_2$, SiN, SiON, etc. Since the hard mask film 4 in this case tends to have low adhesiveness with a resist film of an organic-based material, it is preferable to subject the surface of the hard mask film 4 to HMDS (Hexamethyldisilazane) treatment to enhance surface adhesiveness.

Further, in the case of forming the hard mask film 4 from a material containing tantalum, it is preferable to apply, other than tantalum metal, a material including tantalum containing one or more elements selected from nitrogen, oxygen, boron, and carbon, for example, Ta, TaN, TaO, TaON, TaBN, TaBO, TaBON, TaCN, TaCO, TaCON, TaBCN, and TaBOCN. The hard mask film 4 contains tantalum (Ta) and oxygen (O), which is preferably made of O content of 50 atom % or more (hereinafter referred to as TaO-based material).

It is required for the hard mask film 4 to have sufficiently high etching durability to high-bias etching in patterning the light shielding film 3. Insufficient etching durability causes etching on an edge portion of the pattern of the hard mask film 4 causing reduction of the mask pattern, which degrades precision of a light shielding pattern. By including at least 50 atom % or more oxygen content in a material containing Ta, durability to dry etching by oxygen-containing chlorine-based gas can be significantly enhanced.

It is preferable that the hard mask film 4 of TaO-based material has a microcrystalline crystal structure, preferably amorphous. When crystal structure in the hard mask film 4 of TaO-based material is microcrystalline or amorphous, the structure is unlikely to become a single structure and is likely to become a condition where a plurality of crystal structures is mixed. Therefore, TaO-based material in the hard mask film 4 is likely to form a condition where TaO bond, $Ta_2O_3$ bond, $TaO_2$ bond, and $Ta_2O_5$ bond are mixed (mixed crystal state). As abundance ratio of $Ta_2O_5$ bond increases in TaO-based material in the hard mask film 4, durability to dry etching by oxygen-containing chlorine-based gas tends to be enhanced. Further, as abundance ratio of $Ta_2O_5$ bond increases in TaO-based material in the hard mask film 4, property to prevent hydrogen intrusion, chemical resistance, resistance to hot water, and ArF light fastness also tend to be enhanced.

When oxygen content in the hard mask film 4 of TaO-based material is 50 atom % or more and less than 66.7 atom %, it is considered that $Ta_2O_3$ bond tends to be the majority of the bonding condition of tantalum and oxygen in the film, and it is considered that the amount of TaO bond which is the most unstable bond becomes extremely small compared to the case where oxygen content in the film is less than 50 atom %. When oxygen content in the film is 66.7 atom % or more in the hard mask film 4 of TaO-based material, it is considered that $TaO_2$ bond tends to be the majority of the bonding condition of tantalum and oxygen, and it is considered that the amounts of TaO bond which is the most unstable bond and $Ta_2O_3$ bond which is an unstable bond next thereto both become extremely small.

Further, if the hard mask film 4 of TaO-based material has oxygen content of 67 atom % or more in the film, it can be considered that not only $TaO_2$ bond becomes the majority, but ratio of bonding condition of $Ta_2O_5$ also becomes higher. In such oxygen content, bonding condition of $TaO_2$, and $Ta_2O_3$ rarely exist, and renders bonding condition of TaO to hardly exist. If the hard mask film 4 of TaO-based material has oxygen content in the film of about 71.4 atom %, the film is considered as formed substantially only from bonding condition of $Ta_2O_5$ (since oxygen content of $Ta_2O_5$, the most oxidized bonding condition, is 71.4 atom %).

If the hard mask film 4 of TaO-based material has oxygen content of 50 atom % or more, the film will include not only $Ta_2O_5$ with most stable bonding condition, but also bonding condition of $TaO_2$ and $Ta_2O_3$. On the other hand, in the hard mask film 4 of TaO-based material, the lowest limit of oxygen content including less amount of TaO bond, which is the most unstable bond, within the range of not affecting dry etching durability, is considered as at least 50 atom %.

$Ta_2O_5$ bond is a bonding condition having an extremely high stability, and durability to high-bias etching can be enhanced significantly by increasing abundance ratio of $Ta_2O_5$ bond. Further, mask cleaning durability such as property to prevent hydrogen intrusion, chemical resistance, and resistance to hot water, and ArF light fastness are enhanced significantly. Particularly, it is most preferable that TaO forming the hard mask film 4 is formed only from bonding condition of $Ta_2O_5$. Incidentally, nitrogen and other elements in the hard mask film 4 of TaO-based material are preferably within the range of not affecting these functional effects, and more preferably substantially free thereof.

Further, by forming the hard mask film 4 of TaO-based material from a material where a maximum peak of Ta4f narrow spectrum obtained by analysis of X-ray photoelectron spectroscopy is higher than 23 eV, durability to high-bias etching can be significantly enhanced. Material having high binding energy tends to enhance durability to dry etching by oxygen-containing chlorine-based gas. Further, property to prevent hydrogen intrusion, chemical resistance, resistance to hot water, and ArF light fastness also tend to be enhanced. Bonding condition having the highest binding energy in tantalum compounds is $Ta_2O_5$ bond.

In a material containing tantalum where a maximum peak of Ta4f narrow spectrum is 23 eV or less, $Ta_2O_5$ bond is less likely to exist. Therefore, the hard mask film 4 of TaO-based material preferably has a maximum peak of Ta4f narrow spectrum obtained by analysis of X-ray photoelectron spectroscopy of 24 eV or more, more preferably 25 eV or more, and particularly preferably 25.4 eV or more. When a maximum peak of Ta4f narrow spectrum obtained by analysis of X-ray photoelectron spectroscopy is 25 eV or more, bonding condition of tantalum and oxygen in the hard mask film will mainly be $Ta_2O_5$ bond, significantly enhancing durability to high-bias etching.

TaO-based material forming the hard mask film 4 having oxygen content of 50 atom % tends to have tensile stress. On the contrary, material containing chromium, oxygen, and carbon as main components (CrOC-based material) forming the light shielding film 3 tends to have compressive stress. Generally, annealing is carried out as a treatment to reduce stress on a thin film. However, since it is difficult to heat a thin film of a chromium-based material under high temperature of 300 degrees or more, it is difficult to reduce compressive stress of CrOC-based material down to zero. As in the mask blank 100 of this embodiment, by forming a structure where a hard mask film 4 of TaO-based material is laminated on the light shielding film 3 of CrOC-based material, compensation occurs between compressive stress of the light shielding film 3 and tensile stress of the hard mask film 4 so that stress of the entire laminated structure can be reduced.

[Resist Film]

In the mask blank 100, a resist film made of an organic-based material is preferably formed at a film thickness of 100 nm or less in contact with a surface of the hard mask film 4. In the case of a fine pattern compatible with the DRAM hp32 nm generation, SRAF (Sub-Resolution Assist Feature) having a line width of 40 nm may be provided in a light shielding pattern that is to be formed on the light shielding film 3. However, also in this case, as described above, as a result of providing the hard mask film 4, the film thickness of the resist film can be suppressed, and as a consequence, a cross-sectional aspect ratio of the resist pattern formed of the resist film can be set as low as 1:2.5. Therefore, collapse or peeling off of the resist pattern during the development, rinsing, and the like of the resist film can be suppressed. It is more preferable that the resist film has a film thickness of 80 nm or less. The resist film is preferably a resist for electron beam writing exposure, and it is more preferable that the resist is a chemically amplified resist.

[Mask Blank Manufacturing Process]

The mask blank 100 of the above structure is manufactured through the following procedure. First, a transparent substrate 1 is prepared. This transparent substrate 1 includes an end surface and a main surface polished into a predetermined surface roughness (e.g., root mean square roughness Rq of 0.2 nm or less in an inner region of a square of 1 μm side), and thereafter subjected to predetermined cleaning treatment and drying treatment.

Next, a phase shift film 2 is formed on the transparent substrate 1 by sputtering method. After the phase shift film is formed, annealing is carried out at a predetermined heating temperature. Next, the light shielding film 3 is formed on the phase shift film 2 by sputtering method. Subsequently, the hard mask film 4 is formed on the light shielding film 3 by sputtering method. In formation of each layer by sputtering method, sputtering target and sputtering gas containing materials forming each layer at predetermined composition ratio are used, and moreover, the mixed gas of noble gas and reactive gas mentioned above is used as sputtering gas as necessary. Thereafter, in the case where the mask blank 100 includes a resist film, the surface of the hard mask film 4 is subjected to HMDS (Hexamethyldisilazane) treatment as necessary. Next, a resist film is formed by coating methods such as spin coating on the surface of the hard mask film 4 subjected to HMDS treatment to complete the mask blank 100.

<Method of Manufacturing Phase Shift Mask>

Next, manufacturing method of a phase shift mask according to this embodiment will be explained, with the manufacturing method of a half tone phase shift mask using the mask blank 100 of the structure shown in FIG. 1 as an example.

First, a resist film is formed on the hard mask film 4 of the mask blank 100 by spin-coating. Next, a first pattern (phase shift pattern) to be formed on the phase shift film 2 is drawn on the resist film by exposure writing with electron beam. Thereafter, the resist film is subjected to predetermined treatments such as PEB treatment, developing treatment, and post-baking treatment, and a first pattern (resist pattern 5a) is formed on the resist film (see FIG. 2(a)).

Next, dry etching of the hard mask film 4 is carried out using fluorine-based gas with the resist pattern 5a as a mask, and a first pattern (hard mask pattern 4a) is formed on the hard mask film 4 (see FIG. 2(b)). Subsequently, the resist pattern 5a is removed. Incidentally, dry etching of the light shielding film 3 can be carried out with the resist pattern 5a remaining. In such a case, the resist pattern 5a is eliminated upon dry etching of the light shielding film 3.

Next, high-bias etching using oxygen-containing chlorine-based gas is carried out using the hard mask pattern 4a as a mask, and a first pattern (light shielding pattern 3a) is formed on the light shielding film 3 (see FIG. 2(c)). In dry etching by oxygen-containing chlorine-based gas on the light shielding film 3, etching gas having higher mixing ratio of chlorine-based gas is used than conventionally used. Mixing ratio of mixed gas of chlorine-based gas and oxygen gas in dry etching of the light shielding film 3 is, at gas flow ratio in the etching apparatus, preferably chlorine-based gas: oxygen gas=10 or more:1, more preferably 15 or more:1, and further preferably 20 or more:1. By using etching gas with high mixing ratio of chlorine-based gas, anisotropic property of dry etching can be enhanced. Further, in dry etching of the light shielding film 3, mixing ratio of mixed gas of chlorine-based gas and oxygen gas is, at gas flow ratio in an etching chamber, preferably chlorine-based gas: oxygen gas=40 or less:1.

In dry etching of the light shielding film 3 using oxygen-containing chlorine-based gas, bias voltage to be applied from the back side of the transparent substrate 1 is set to be higher than what is conventionally done. Although effects of increasing bias voltage vary depending on etching apparatuses, power [W] upon application of the bias voltage is, for example, preferably 15 [W] or more, more preferably 20 [W] or more, and even more preferably 30 [W] or more. By increasing bias voltage, anisotropic property of dry etching by oxygen-containing chlorine-based gas can be enhanced.

Subsequently, dry etching is carried out using fluorine-based gas with the light shielding pattern 3a as a mask, a first pattern (phase shift pattern 2a) is formed on the phase shift film 2, and the hard mask pattern 4a is removed (see FIG. 2(d)). Next, a resist film is formed on the light shielding pattern 3a by spin coating. On the resist film, a second pattern (light shielding pattern) that should be formed on the light shielding film 3 is drawn by exposure writing with electron beam. Thereafter, predetermined treatments such as developing treatment are carried out, and a resist film (resist pattern 6b) having a second pattern (light shielding pattern) is formed (see FIG. 2(e)).

Next, dry etching is carried out using a mixed gas of chlorine-based gas and oxygen gas with the resist pattern 6b as a mask, and a second pattern (light shielding pattern 3b) is formed on the light shielding film 3 (see FIG. 2(f)). Incidentally, dry etching of the light shielding film 3 at this stage can be done under conventional conditions for bias voltage and mixing ratio of chlorine-based gas and oxygen gas. Further, the resist pattern 6b is removed, predetermined treatments such as cleaning are carried out, and a phase shift mask 200 is obtained (see FIG. 2(g)).

There is no particular limitation to chlorine-based gas used for dry etching in the above manufacturing step, as long as Cl is included, the chlorine-based gas including, for example, $Cl_2$, $SiCl_2$, $CHCl_3$, $CH_2Cl_2$, $CCl_4$, and $BCl_3$. Further, there is no particular limitation to fluorine-based gas to be used for the dry etching in the above manufacturing step, as long as F is included, the fluorine-based gas including, for example, $CHF_3$, $CF_4$, $C_2F_6$, $C_4F_8$, and $SF_6$. Particularly, fluorine-based gas free of C can further reduce damage on a glass substrate for having a relatively low etching rate to a glass substrate.

The phase shift mask 200 manufactured through the above steps has a structure where the transparent substrate 1 has a phase shift pattern 2a and a light shielding pattern 3b laminated in this order from the transparent substrate 1 side.

In the manufacturing method of the phase shift mask explained above, the phase shift mask 200 is manufactured using the mask blank 100 explained in FIG. 1. In the manufacture of the phase shift mask described above, dry etching by oxygen-containing chlorine-based gas having tendency of isotropic etching is applied in the step of FIG. 2(c) which is a dry etching step for forming a phase shift pattern (fine pattern that should be formed on the phase shift film 2) on the light shielding film 3. Further, the dry etching by oxygen-containing chlorine-based gas in the step of FIG. 2(c) is carried out under an etching condition having higher ratio of chlorine-based gas in the oxygen-containing chlorine-based gas and applying high bias. Thus, in the step of dry etching of the light shielding film 3, reduction of etching rate can be suppressed while enhancing tendency of anisotropic property of etching. Thus, side etching when forming a phase shift pattern on the light shielding film 3 is reduced.

By using the light shielding pattern 3a with reduced side etching and having a precisely formed phase shift pattern as an etching mask and etching the phase shift film 2 using fluorine-based gas through dry etching, the phase shift pattern 2a can be formed with high precision. Through the above action, the phase shift mask 200 with excellent pattern precision can be manufactured.

<Manufacturing Method of Semiconductor Device>

Next, manufacturing method of a semiconductor device using the phase shift mask manufactured by the above-mentioned manufacturing method is described. The manufacturing method of the semiconductor device is characterized in using the half tone phase shift mask 200 manufactured by the above manufacturing method, and exposure-transferring a transfer pattern (phase shift pattern 2a) of the phase shift mask 200 on a resist film on a substrate. The manufacturing method of the semiconductor device as above is carried out as follows.

First, a substrate for forming the semiconductor device is prepared. The substrate can be, for example, a semiconductor substrate, a substrate having a semiconductor thin film, and can further have a fine-processed film formed thereon. A resist film is formed on the prepared substrate, and the resist film is subjected to pattern exposure using the half tone phase shift mask 200 manufactured by the manufacturing method mentioned above. Thus, the transfer pattern formed on the phase shift mask 200 is exposure-transferred to the resist film. On this occasion, exposure light corresponding to the phase shift film 2 forming the transfer pattern is used as the exposure light, for example, ArF excimer laser light is used herein.

Further, the resist film onto which the transfer pattern is exposure-transferred is subjected to developing treatment to form a resist pattern, subjected to etching processing on a surface layer of the substrate using the resist pattern as a mask, treated to introduce impurities, etc. After the completion of the treatments, the resist pattern is removed. The above treatments are repeated on the substrate while replacing the transfer mask, and through further necessary processing, the semiconductor device is completed.

In the manufacture of the semiconductor device as mentioned above, a resist pattern with a precision that sufficiently satisfies initial design specification can be formed on the substrate by using the half tone phase shift mask manufactured by the above-mentioned manufacturing method. Therefore, in the case where a lower layer film below the resist film is dry etched to form a circuit pattern using the pattern of the resist film as a mask, a highly precise circuit pattern without short-circuit of wiring and disconnection caused by insufficient precision can be formed.

EXAMPLES

The embodiments of this invention are further described concretely below along with examples.

Example 1

[Manufacture of Mask Blank]

In view of FIG. 1, a transparent substrate 1 made of a synthetic quartz glass with a size of a main surface of about 152 mm×about 152 mm and a thickness of about 6.35 mm was prepared. End surface and main surface of the transparent substrate 1 were polished to a predetermined surface roughness (0.2 nm or less Rq), and thereafter subjected to predetermined cleaning treatment and drying treatment.

Next, the transparent substrate 1 was placed in a single-wafer DC sputtering apparatus, and by reactive sputtering (DC sputtering) using a mix-sintered target of molybdenum (Mo) and silicon (Si) (Mo:Si=11 atom %:89 atom %) and with a mixed gas of argon (Ar), nitrogen ($N_2$), and helium (He) as sputtering gas, a phase shift film 2 made of molybdenum, silicon, and nitrogen was formed on the transparent substrate 1 at a thickness of 69 nm.

Next, the transparent substrate 1 having the phase shift film 2 formed thereon was subjected to heat treatment for reducing film stress of the phase shift film 2 and for forming an oxidization layer on the surface layer. Concretely, the heat treatment was carried out using a heating furnace (electric furnace) at a heating temperature of 450° C. in the atmosphere for one hour. Transmittance and phase difference of the phase shift film 2 after the heat treatment to a light of 193 nm wavelength were measured using a phase shift measurement apparatus (MPM193 manufactured by Lasertec), and the transmittance was 6.0% and the phase difference was 177.0 degrees.

Next, the transparent substrate 1 having the phase shift film 2 formed thereon was placed in a single-wafer DC sputtering apparatus, and reactive sputtering (DC sputtering) was carried out using a chromium (Cr) target under an environment of a mixed gas of argon (Ar), carbon dioxide ($CO_2$), and helium (He). Thus, a light shielding film (CrOC film) 3 made of chromium, oxygen, and carbon was formed at a film thickness of 36 nm in contact with the phase shift film 2.

Next, the transparent substrate 1 having the light shielding film (CrOC film) 3 formed thereon was subjected to heat treatment. Concretely, the heat treatment was carried out using a hot plate at a heating temperature of 280° C. in the atmosphere for five minutes. After the heat treatment, a spectrophotometer (Cary4000 manufactured by Agilent Technologies) was used on the transparent substrate 1 having the phase shift film 2 and the light shielding film 3 laminated thereon to measure optical density of the laminated structure of the phase shift film 2 and the light shielding film 3 to ArF excimer laser light wavelength (about 193 nm), confirming the value of 3.0 or more.

Next, the transparent substrate 1 having the phase shift film 2 and the light shielding film 3 laminated thereon was placed in a single-wafer RF sputtering apparatus, and by RF sputtering using silicon dioxide ($SiO_2$) target and argon (Ar) gas as sputtering gas, a hard mask film 4 made of silicon and oxygen was formed on the light shielding film 3 at a thickness of 12 nm. Further, a predetermined cleaning treatment was carried out to form a mask blank 100 of Example 1.

Another transparent substrate 1 was prepared, which has only the light shielding film 3 formed on its main surface under the same conditions as above, and which was subjected to heat treatment. The light shielding film 3 was analyzed by an X-ray photoelectron spectroscopy (with XPS, RBS corrections). As a result, it was confirmed that the region near the surface that is opposite of the transparent substrate 1 side of the light shielding film 3 (region up to about 2 nm depth from the surface) has a composition gradient portion having more oxygen content than other regions (40 atom % or more oxygen content). Further, content of each constituent element in the region of the light shielding film 3 excluding the composition gradient portion was found to be, at an average value, Cr: 71 atom %, O: 15 atom %, and C: 14 atom %. Moreover, it was confirmed that each difference of each constituent element in thickness direction of the region of the light shielding film 3 excluding the composition gradient portion is 3 atom % or less, and there is substantially no composition gradient in thickness direction.

On the result obtained as analysis result by X-ray photoelectron spectroscopy on the light shielding film 3 of Example 1, result of depth direction chemical bonding condition analysis of Cr2p narrow spectrum is shown in FIG. 3, result of depth direction chemical bonding condition analysis of O1s narrow spectrum is shown in FIG. 4, result of depth direction chemical bonding condition analysis of N1s narrow spectrum is shown in FIG. 5, result of depth direction chemical bonding condition analysis of C1s narrow spectrum is shown in FIG. 6, and result of depth direction chemical bonding condition analysis of Si2p narrow spectrum is shown in FIG. 7, respectively.

In the analysis of X-ray photoelectron spectroscopy on the light shielding film 3, steps of irradiating X-ray on the surface of the light shielding film 3 to measure energy distribution of photoelectron emitted from the light shielding film 3, digging the light shielding film 3 for a predetermined time through Ar gas sputtering, irradiating X-ray on the surface of the light shielding film 3 of the dug region, and measuring the energy distribution of photoelectron emitted from the light shielding film 3 are repeated to analyze film thickness direction of the light shielding film 3. Incidentally, this analysis of X-ray photoelectron spectroscopy was carried out using monochromatized Al (1486.6 eV) as an X-ray source, under the conditions of 100 μmφ photoelectron detection area and about 4-5 nm detection depth (take-off angle 45 deg) (the same applies to other Examples and Comparative Examples hereinafter).

In each depth direction chemical bonding condition analysis in FIG. 3 to FIG. 6, "0.00 min plot" shows the analysis result of a uppermost surface of the light shielding film 3 before Ar gas sputtering (sputtering time: 0 min), "0.80 min plot" shows the analysis result at a position in film thickness direction of the light shielding film 3 after a uppermost surface of the light shielding film 3 was dug only for 0.80 min by Ar gas sputtering, "1.60 min plot" shows analysis result at a position in film thickness direction of the light shielding film 3 after a uppermost surface of the light shielding film 3 was dug only for 1.60 min by Ar gas sputtering, "5.60 min plot" shows analysis result at a position in film thickness direction of the light shielding film 3 after a uppermost surface of the light shielding film 3 was dug only for 5.60 min by Ar gas sputtering, and "12.00 min plot" shows analysis result at a position in film thickness direction of the light shielding film 3 after a uppermost surface of the light shielding film 3 was dug only for 12.00 min by Ar gas sputtering.

Incidentally, the position in film thickness direction of the light shielding film 3 after a uppermost surface of the light shielding film 3 was dug only for 0.80 min by Ar gas sputtering is the position deeper than the composition gradient portion. Namely, all plots of the positions of depth of "0.80 min plot" and thereafter are measured result of the portion of the light shielding film 3 excluding the composition gradient portion.

The result of Cr2p narrow spectrum in FIG. 3 proves that the light shielding film 3 of Example 1 has a maximum peak at 574 eV binding energy, except for the uppermost surface (0.00 min plot). This result indicates the existence of chromium atoms that are not bonded to atoms such as nitrogen and oxygen at or more than a certain ratio.

The result of O1s narrow spectrum of FIG. 4 proves that the light shielding film 3 of Example 1 has a maximum peak at about 530 eV binding energy, except for the uppermost surface (0.00 min plot). This result indicates the existence of Cr—O bond at or more than a certain ratio.

The result of N1s narrow spectrum of FIG. 5 proves that the light shielding film 3 of Example 1 has a maximum peak of lower detection limit or less in all depth regions. The result indicates that abundance ratio of atoms bonded to nitrogen, including Cr—N bond, was not detected in the light shielding film 3.

The result of C1s narrow spectrum of FIG. 6 proves that the light shielding film 3 of Example 1 has a maximum peak at 282-283 eV binding energy, except for the uppermost surface (0.00 min plot). This result indicates the existence of Cr—C bond at or more than a certain ratio.

The result of Si2p narrow spectrum of FIG. 7 proves that the light shielding film 3 of Example 1 has a maximum peak of lower detection limit or less in all depth regions. The result indicates that abundance ratio of atoms bonded to silicon, including Cr—Si bond, was not detected in the light shielding film 3.

[Manufacture of Phase Shift Mask]

Next, a half tone phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with the surface of the hard mask film 4 by spin coating at a film thickness of 80 nm. Next, a first pattern, which is a phase shift pattern to be formed on the phase shift film 2, was drawn on the resist film with electron beam, predetermined developing and cleaning treatments were conducted, and a resist pattern 5a having the first pattern was formed (see FIG. 2(a)). The first pattern was formed to include a line-and-space pattern having a line width of 100 nm.

Next, dry etching was conducted using $CF_4$ gas with the resist pattern 5a as a mask, and a first pattern (hard mask pattern 4a) was formed on the hard mask film 4 (see FIG. 2(b)). Length measurement of space width was made on the formed hard mask pattern 4a at the region where the line-and-space pattern is formed, using a length measurement SEM (CD-SEM: Critical Dimension-Scanning Electron Microscope).

Next, the resist pattern 5a was removed. Subsequently, dry etching (high-bias etching where power when bias voltage was applied is 50 [W]) using a mixed gas of chlorine gas ($Cl_2$) and oxygen gas ($O_2$) (gas flow ratio $Cl_2:O_2=13:1$) was conducted with the hard mask pattern 4a as a mask, and a first pattern (light shielding pattern 3a) was formed on the light shielding film 3 (see FIG. 2(c)). Incidentally, the time applied as an etching time of the light shielding film 3 (total etching time) is 1.5 times from the initiation of etching of the light shielding film 3 until the surface of the phase shift film 2 first appears (just etching time). Namely, over etching was carried out with an addition of only 50% of the just etching time (over etching time). By carrying out the over etching, verticality of the pattern side wall of the light shielding film 3 can be enhanced.

Next, dry etching was conducted using fluorine-based gas ($SF_6$+He) with the light shielding pattern 3a as a mask, and a first pattern (phase shift pattern 2a) was formed on the phase shift film 2, and at the same time the hard mask pattern 4a was removed (see FIG. 2(d)).

Length measurement of space width was carried out on the formed phase shift pattern 2a in the region where the line-and-space pattern is formed using a length measurement SEM (CD-SEM: Critical Dimension-Scanning Electron Microscope). Thereafter, etching bias, which is the change amount between the previously-measured space width of the hard mask pattern 4a and the space width of the phase shift pattern 2a, was calculated for each of the plurality of locations in the region where the same line-and-space pattern is formed, and further, average value of etching bias was calculated. As a result, the average value of etching bias was about 4 nm, which was significantly less than conventional. This shows that even if the light shielding film 3 is patterned through high-bias etching using the hard mask pattern 4a having a fine transfer pattern that should be formed on the phase shift film 2 as an etching mask, the fine transfer pattern can be formed on the light shielding film 3 at high precision.

Next, a resist film of a chemically amplified resist for electron beam writing was formed on the light shielding pattern 3a by spin coating at a film thickness of 150 nm. Next, a second pattern, which is a pattern (pattern including light shielding band pattern) to be formed on the light shielding film, was exposed and drawn on the resist film, further subjected to predetermined treatments such as developing, and a resist pattern 6b having the light shielding pattern was formed (see FIG. 2(e)). Subsequently, dry etching was conducted with a mixed gas of chlorine gas ($Cl_2$) and oxygen gas ($O_2$) (gas flow ratio $Cl_2:O_2=4:1$) using the resist pattern 6b as a mask, and a second pattern (light shielding pattern 3b) was formed on the light shielding film 3 (see FIG. 2(f)). Further, the resist pattern 6b was removed, predetermined treatments such as cleaning were carried out, and the phase shift mask 200 was obtained (see FIG. 2(g)).

[Evaluation of Pattern Transfer Performance]

On the phase shift mask 200 manufactured by the above procedures, a simulation of a transfer image was made when an exposure transfer was made on a resist film on a semiconductor device using AIMS193 (manufactured by Carl Zeiss) at an exposure light of wavelength 193 nm. The simulated exposure transfer image was inspected, and the design specification was fully satisfied. It can be considered from this result that a circuit pattern to be finally formed on the semiconductor device can be formed at a high precision, even if the phase shift mask 200 of Example 1 was set on a mask stage of an exposure apparatus and a resist film on the semiconductor device was subjected to exposure transfer.

Example 2

[Manufacture of Mask Blank]

A mask blank 100 of Example 2 was manufactured by the same process as Example 1 except for the light shielding film 3. The light shielding film 3 of Example 2 has film forming conditions that are different from the light shielding film 3 of Example 1. Namely, a transparent substrate 1 having a phase shift film 2 formed thereon is placed in a single-wafer DC sputtering apparatus, and reactive sputtering (DC sputtering) was carried out using a chromium (Cr) target under mixed gas atmosphere of argon (Ar), carbon dioxide ($CO_2$), and helium (He). Thus, a light shielding film (CrOC film) 3 made of chromium, oxygen, and carbon was formed at a film thickness of 43 nm in contact with the phase shift film 2.

Next, the transparent substrate 1 having the light shielding film (CrOC film) 3 formed thereon was subjected to heat treatment with the same conditions as Example 1. After the heat treatment, a spectrophotometer (Cary4000 manufactured by Agilent Technologies) was used on the transparent substrate 1 having the phase shift film 2 and the light shielding film 3 laminated thereon to measure optical density of the laminated structure of the phase shift film 2 and the light shielding film 3 to ArF excimer laser light wavelength (about 193 nm), confirming the value of 3.0 or more.

Another transparent substrate 1 was prepared, which has only the light shielding film 3 formed on its main surface under the same conditions as above, and which was subjected to heat treatment. The light shielding film 3 was analyzed by an X-ray photoelectron spectroscopy (with XPS, RBS corrections). As a result, it was confirmed that the region near the surface that is opposite the transparent substrate 1 side of the light shielding film 3 (region up to about 2 nm depth from the surface) has a composition gradient portion having more oxygen content than other regions (40 atom % or more oxygen content). Further, content of each constituent element in the region of the light shielding film 3 excluding the composition gradient portion was found to be, at an average value, Cr: 55 atom %, O: 30 atom %, and C: 15 atom %. Moreover, it was confirmed that difference of each constituent element in thickness direction of the region of the light shielding film 3 excluding the composition gradient portion is 3 atom % or less, and there is substantially no composition gradient in thickness direction.

Further, similar to the case of Example 1, result of depth direction chemical bonding condition analysis of Cr2p narrow spectrum (see FIG. 8), result of depth direction chemical bonding condition analysis of O1s narrow spectrum (see FIG. 9), result of depth direction chemical bonding condition analysis of N1s narrow spectrum (see FIG. 10), result of depth direction chemical bonding condition analysis of C1s narrow spectrum (see FIG. 11), and result of depth direction chemical bonding condition analysis of Si2p narrow spectrum (see FIG. 12) were each obtained for the light shielding film 3 of Example 2.

In each depth direction chemical bonding condition analysis in FIG. 8 to FIG. 12, "0.00 min plot" shows analysis result of a uppermost surface of the light shielding film 3 before Ar gas sputtering (sputtering time: 0 min), "0.40 min plot" shows analysis result at a position in film thickness direction of the light shielding film 3 after a uppermost surface of the light shielding film 3 was dug only for 0.40 min by Ar gas sputtering, "0.80 min plot" shows analysis result at a position in film thickness direction of the light shielding film 3 after a uppermost surface of the light shielding film 3 was dug for only 0.80 min by Ar gas sputtering, "1.60 min plot" shows analysis result at a position in film thickness direction of the light shielding film 3 after a uppermost surface of the light shielding film 3 was dug only for 1.60 min by Ar gas sputtering, "2.80 min plot" shows analysis result at a position in film thickness direction of the light shielding film 3 after a uppermost surface of the light shielding film 3 was dug only for 2.80 min by Ar gas sputtering, and "3.20 min plot" shows analysis result at a position in film thickness direction of the light shielding film 3 after a uppermost surface of the light shielding film 3 was dug only for 3.20 min by Ar gas sputtering.

Incidentally, the position in film thickness direction of the light shielding film 3 after a uppermost surface of the light shielding film 3 was dug only for 0.40 min by Ar gas sputtering is a position deeper than the composition gradient portion. Namely, all of the plots of the position of depth of "0.40 min plot" and thereafter are measurement results of the portion of the light shielding film 3 excluding the composition gradient portion.

The result of Cr2p narrow spectrum of FIG. 8 proves that the light shielding film 3 of Example 2 has a maximum peak at 574 eV binding energy, except for the uppermost surface (0.00 min plot). This result indicates the existence of chromium atoms that are not bonded to atoms such as nitrogen and oxygen at or more than a certain ratio.

The result of O1s narrow spectrum of FIG. 9 proves that the light shielding film 3 of Example 2 has a maximum peak at about 530 eV binding energy, except for the uppermost surface (0.00 min plot). This result indicates the existence of Cr—O bond at or more than a certain ratio.

The result of N1s narrow spectrum of FIG. 10 proves that the light shielding film 3 of Example 2 has a maximum peak of lower detection limit or less in all depth regions. The result indicates that abundance ratio of atoms bonded to nitrogen, including Cr—N bond, was not detected in the light shielding film 3.

The result of C1s narrow spectrum of FIG. 11 proves that the light shielding film 3 of Example 2 has a maximum peak at 282-283 eV binding energy, except for the uppermost surface (0.00 min plot). This result indicates the existence of Cr—C bond at or more than a certain ratio.

The result of Si2p narrow spectrum of FIG. 12 proves that the light shielding film 3 of Example 2 has a maximum peak of lower detection limit or less in all depth regions. The result indicates that abundance ratio of atoms bonded to silicon, including Cr—Si bond, was not detected in the light shielding film 3.

[Manufacture of Phase Shift Mask]

Next, a phase shift mask 200 of Example 2 was manufactured using the mask blank 100 of Example 2 through the procedure similar to Example 1. Similar to the case of Example 1, length measurement of space width was carried out on the region where the line-and-space pattern is formed after the hard mask pattern 4a was formed (see FIG. 2(*b*)) and after the phase shift pattern 2a was formed (see FIG. 2(*d*)), respectively, using a length measurement SEM (CD-SEM: Critical Dimension-Scanning Electron Microscope). Thereafter, etching bias, which is the change amount between the space width of the hard mask pattern 4a and the space width of the phase shift pattern 2a, was calculated for each of the plurality of locations in the region where the same line-and-space pattern is formed, and further, average value of etching bias was calculated. As a result, the average value of etching bias was about 8 nm, which was sufficiently less than conventional. This shows that in the mask blank 100 of Example 2, even if the light shielding film 3 is patterned through high-bias etching using the hard mask pattern 4a having a fine transfer pattern that should be formed on the phase shift film 2 as an etching mask, the fine transfer pattern can be formed on the light shielding film 3 at high precision.

[Evaluation of Pattern Transfer Performance]

On the phase shift mask 200 of Example 2, a simulation of a transfer image was made when an exposure transfer was made on a resist film on a semiconductor device using AIMS193 (manufactured by Carl Zeiss) at an exposure light of wavelength 193 nm. The exposure transfer image of this simulation was verified, and the design specification was sufficiently satisfied. It can be considered from this result that a circuit pattern to be finally formed on the semiconductor device can be formed at a high precision, even if the phase shift mask 200 of Example 2 was set on a mask stage of an exposure apparatus and a resist film on the semiconductor device was subjected to exposure transfer.

Example 3

[Manufacture of Mask Blank]

A mask blank 100 of Example 3 was manufactured by the same process as Example 1, except for the light shielding film 3. A light shielding film 3 of Example 3 is similar to the light shielding film 3 of Example 1, except for the film thickness which was changed to 18 nm. Thus, the result of analysis on the light shielding film 3 of Example 3 by an X-ray photoelectron spectroscopy (with XPS, RBS corrections) is similar to the light shielding film 3 of Example 1. Further, the result of depth direction chemical bonding condition analysis of each narrow spectrum Cr2p, O1s, N1s, C1s, and Si2p is similar to the light shielding film 3 of Example 1.

After the heat treatment similar to Example 1, a spectrophotometer (manufactured by Agilent Technologies Cary4000) was used on the transparent substrate 1 having the phase shift film 2 and the light shielding film 3 of Example 3 laminated thereon to measure optical density of the laminated structure of the phase shift film 2 and the light shielding film 3 under ArF excimer laser light wavelength (about 193 nm), and the optical density was 2.1.

[Manufacture of Phase Shift Mask]

Next, using the mask blank 100 of Example 3, a phase shift mask 200 of Example 3 was manufactured with the same process as Example 1. However, in the manufacture of the phase shift mask 200 of Example 3, over etching time was set to be 100% the just etching time in forming a first pattern on the light shielding film 3 through high-bias etching using the hard mask pattern 4a as an etching mask. Since film thickness of the light shielding film 3 of Example 3 became about ½ thickness compared to the light shielding film 3 of Example 1, just etching time in Example 3 is significantly reduced down to about ½ the just etching time in Example 1. On the contrary, if the over etching time in Example 3 is reduced down to about ½ of just etching time as in Example 1 (i.e., about ¼ of just etching time in Example 1), verticality of the shape of the pattern side wall of the light shielding film 3 cannot be enhanced.

Similar to the case of Example 1, length measurement of space width was carried out in the region where the line-and-space pattern is formed after the hard mask pattern 4a was formed (see FIG. 2(b)) and after the phase shift pattern 2a was formed (see FIG. 2(d)), respectively, using a length measurement SEM (CD-SEM: Critical Dimension-Scanning Electron Microscope). Thereafter, etching bias, which is the change amount between the space width of the hard mask pattern 4a and the space width of the phase shift pattern 2a, was calculated for each of the plurality of locations in the region where the same line-and-space pattern is formed, and further, average value of etching bias was calculated. As a result, average value of etching bias was about 3 nm, which was significantly less than conventional. This shows that in the mask blank 100 of Example 3, even if the light shielding film 3 is patterned through high-bias etching using the hard mask pattern 4a having a fine transfer pattern that should be formed on the phase shift film 2 as an etching mask, the fine transfer pattern can be formed on the light shielding film 3 at high precision.

[Evaluation of Pattern Transfer Performance]

On the phase shift mask 200 of Example 3, a simulation of a transfer image was made when an exposure transfer was made on a resist film on a semiconductor device using AIMS193 (manufactured by Carl Zeiss) at an exposure light of wavelength 193 nm, similar to Example 1. The exposure transfer image of this simulation was verified, and the design specification was sufficiently satisfied. It can be considered from this result that a circuit pattern to be finally formed on the semiconductor device can be formed at high precision, even if the phase shift mask 200 of Example 3 was set on a mask stage of an exposure apparatus and a resist film on the semiconductor device was subjected to exposure transfer.

Example 4

[Manufacture of Mask Blank]

A mask blank 100 of Example 4 was manufactured through the procedure similar to Example 2, except for the light shielding film 3. A light shielding film 3 of Example 4 is similar to the light shielding film 3 of Example 2, except for the film thickness which was changed to 23 nm. Thus, the result of analysis of X-ray photoelectron spectroscopy (with XPS, RBS corrections) on the light shielding film 3 of Example 4 is similar to the light shielding film 3 of Example 2. Further, the result of depth direction chemical bonding condition analysis of each narrow spectrum of Cr2p, O1s, N1s, C1s, and Si2p is similar to the light shielding film 3 of Example 2.

After the heat treatment similar to Example 1, a spectrophotometer (Cary4000 manufactured by Agilent Technologies) was used on the transparent substrate 1 having the phase shift film 2 and the light shielding film 3 of Example 4 laminated thereon to measure optical density of the laminated structure of the phase shift film 2 and the light shielding film 3 under ArF excimer laser light wavelength (about 193 nm), and the optical density was 2.1.

[Manufacture of Phase Shift Mask]

Next, a phase shift mask 200 of Example 4 was manufactured using the mask blank 100 of Example 4 through a procedure similar to Example 2. However, in the manufacture of the phase shift mask 200 of Example 4, over etching time was set to be 100% of just etching time in forming a first pattern on the light shielding film 3 through high-bias etching using the hard mask pattern 4a as an etching mask. Since film thickness of the light shielding film 3 of Example 4 became about ½ thickness compared to the light shielding film 3 of Example 2, just etching time in Example 4 is significantly reduced down to about ½ the just etching time in Example 2. On the contrary, if the over etching time is reduced down to about ½, verticality of the shape of pattern side wall of the light shielding film 3 cannot be enhanced.

Similar to the case of Example 1, length measurement of space width was carried out in the region where the line-and-space pattern is formed after the hard mask pattern 4a was formed (see FIG. 2(b)) and after the phase shift pattern 2a was formed (see FIG. 2(d)), respectively, using a length measurement SEM (CD-SEM: Critical Dimension-Scanning Electron Microscope). Thereafter, etching bias, which is the change amount between the space width of the hard mask pattern 4a and the space width of the phase shift pattern 2a, was calculated for each of the plurality of locations in the region where the same line-and-space pattern is formed, and further, average value of etching bias was calculated. As a result, the average value of etching bias was about 7 nm, which was sufficiently less than conventional. This shows that in the mask blank 100 of Example 4, even if the light shielding film is patterned through high-bias etching using the hard mask pattern 4a having a fine transfer pattern that should be formed on the phase shift film 2 as an etching mask, the fine transfer pattern can be formed on the light shielding film 3 at high precision.

[Evaluation of Pattern Transfer Performance]

On the phase shift mask 200 of Example 4, a simulation of a transfer image was made when an exposure transfer was made on a resist film on a semiconductor device using AIMS193 (manufactured by Carl Zeiss) at an exposure light of wavelength 193 nm, similar to Example 1. The exposure transfer image of this simulation was verified, and the design specification was sufficiently satisfied. It can be considered from this result that a circuit pattern to be finally formed on the semiconductor device can be formed at high precision, even if the phase shift mask 200 of Example 4 was set on a mask stage of an exposure apparatus and a resist film on the semiconductor device was subjected to exposure transfer.

Comparative Example 1

[Manufacture of Mask Blank]

A mask blank of Comparative Example 1 was manufactured by the same process as Example 1, except for the light shielding film 3. A light shielding film of Comparative Example 1 has film forming conditions that are different than the light shielding film 3 of Example 1. Concretely, a transparent substrate 1 having a phase shift film 2 formed thereon is placed in a single-wafer DC sputtering apparatus, and reactive sputtering (DC sputtering) was carried out using chromium (Cr) target under mixed gas atmosphere of argon (Ar), carbon dioxide ($CO_2$), nitrogen ($N_2$), and helium (He). Thus, a light shielding film (CrOCN film) made of chromium, oxygen, carbon, and nitrogen was formed at a film thickness of 43 nm in contact with the phase shift film 2.

Next, the transparent substrate having the light shielding film (CrOCN film) formed thereon was subjected to heat treatment under the same conditions as Example 1. After the heat treatment, a spectrophotometer (Cary4000 manufactured by Agilent Technologies) was used on the transparent substrate having the phase shift film and the light shielding film laminated thereon to measure optical density of the laminated structure of the phase shift film and the light shielding film under ArF excimer laser light wavelength (about 193 nm), confirming the optical density of 3.0 or more.

Another transparent substrate was prepared, which has only a light shielding film formed on its main surface under the same conditions as above, and which was subjected to heat treatment. The light shielding film was analyzed by an X-ray photoelectron spectroscopy (with XPS, RBS corrections). As a result, it was confirmed that the region near the surface that is opposite of the transparent substrate side of the light shielding film (region up to about 2 nm depth from the surface) has a composition gradient portion having more oxygen content than other regions (40 atom % or more oxygen content). Further, content of each constituent element in the region of the light shielding film excluding the composition gradient portion was found to be, at an average value, Cr: 55 atom %, O: 22 atom %, C: 12 atom %, and N: 11 atom %. Moreover, it was confirmed that the difference of each constituent element in thickness direction of the region of the light shielding film excluding the composition gradient portion is 3 atom % or less, and there is substantially no composition gradient in thickness direction.

Another transparent substrate was prepared, which has only a light shielding film formed on its main surface under the same conditions as above, which was subjected to heat treatment, and further, a hard mask film was formed in contact with a surface of the light shielding film after the heat treatment. On the hard mask film and the light shielding film of Comparative Example 1, result of depth direction chemical bonding condition analysis of Cr2p narrow spectrum (see FIG. 13), result of depth direction chemical bonding condition analysis of O1s narrow spectrum (see FIG. 14), result of depth direction chemical bonding condition analysis of N1s narrow spectrum (see FIG. 15), result of depth direction chemical bonding condition analysis of C1s narrow spectrum (see FIG. 16), and result of depth direction chemical bonding condition analysis of Si2p narrow spectrum (see FIG. 17) were each obtained under the measurement conditions similar to the case of Example 1.

In each depth direction chemical bonding condition analysis in FIG. 13 to FIG. 17, "0.00 min plot" shows analysis result of a hard mask film before Ar gas sputtering (sputtering time: 0 min), "0.40 min plot" shows analysis result at a position dug from a uppermost surface of a hard mask film only for 0.40 min by Ar gas sputtering, "1.60 min plot" shows analysis result at a position dug from a uppermost surface of a hard mask film only for 1.60 min by Ar gas sputtering, "3.00 min plot" shows analysis result at a position dug from a uppermost surface of a hard mask film only for 3.00 min by Ar gas sputtering, "5.00 min plot" shows analysis result at a position dug from a uppermost surface of a hard mask film only for 5.00 min by Ar gas sputtering, and "8.40 min plot" shows analysis result at a position dug from uppermost surface of a hard mask film for only 8.40 min by Ar gas sputtering.

Incidentally, the position dug from a uppermost surface of a hard mask film only for 1.60 min by Ar gas sputtering is the interior of the light shielding film, and is a position deeper than the composition gradient portion. Namely, all of the plots of the positions of "1.60 min plot" and thereafter are measurement results of portion of the light shielding film excluding the composition gradient portion of Comparative Example 1.

The result of Cr2p narrow spectrum of FIG. 13 proves that the light shielding film of Comparative Example 1 has a maximum peak at binding energy greater than 574 eV in the region of depth of "1.60 min plot" and thereafter. This result can be considered as under so-called chemical shift, indicating that abundance ratio of chromium atoms that are not bonded to atoms such as nitrogen and oxygen is significantly low.

The result of O1s narrow spectrum in FIG. 14 proves that the light shielding film of Comparative Example 1 has a maximum peak at about 530 eV binding energy in the region of depth of "1.60 min plot" and thereafter. This result indicates the existence of Cr—O bond at a certain ratio or more.

The result of N1s narrow spectrum in FIG. 15 proves that the light shielding film of Comparative Example 1 has a maximum peak at about 397 eV binding energy in the region of depth of "1.60 min plot" and thereafter. This result indicates the existence of Cr—N bond at a certain ratio or more.

The result of C1s narrow spectrum in FIG. 16 proves that the light shielding film of Comparative Example 1 has a maximum peak at 283 eV binding energy in the region of depth of "1.60 min plot" and thereafter. This result indicates the existence of Cr—C bond at a certain ratio or more.

The result of Si2p narrow spectrum in FIG. 17 proves that the light shielding film of Comparative Example 1 has a maximum peak that is at or below lower detection limit in the region of depth of "1.60 min plot" and thereafter. The result indicates that abundance ratio of atoms bonded to silicon, including Cr—Si bond, was not detected in the light shielding film of Comparative Example 1.

[Manufacture of Phase Shift Mask]

Next, a phase shift mask of Comparative Example 1 was manufactured using the mask blank of Comparative Example 1 through the procedure similar to Example 1. Similar to the case of Example 1, length measurement of space width was carried out in the region where the line-and-space pattern is formed after the hard mask pattern was formed (see FIG. 2(b)) and after the phase shift pattern was formed (see FIG. 2(d)), respectively, using a length measurement SEM (CD-SEM: Critical Dimension-Scanning Electron Microscope). Thereafter, etching bias, which is the change amount between the space width of the hard mask pattern and the space width of the phase shift pattern was calculated for each of the plurality of locations in the region where the same line-and-space pattern is formed, and further, average value of etching bias was calculated. As a result, average value of etching bias was 15 nm, which was a rather great value. This indicates that in the case where a light shielding film was patterned through high-bias etching using a hard mask pattern having a fine transfer pattern that should be formed on a phase shift film as an etching mask in the mask blank of Comparative Example 1, it is difficult to form the fine transfer pattern precisely on the light shielding film.

[Evaluation of Pattern Transfer Performance]

On the phase shift mask of Comparative Example 1, a simulation of a transfer image was made when an exposure transfer was made on a resist film on a semiconductor device using AIMS193 (manufactured by Carl Zeiss) at an exposure light of wavelength 193 nm, similar to Example 1. The exposure transfer image of this simulation was verified, and a transfer defect was confirmed. Generation factor of the transfer defect is inferred as poor verticality of the shape caused by large side etching amount in the pattern side wall of the light shielding pattern, and moreover, low in-plane CD uniformity. From this result, it can be considered that when the phase shift mask of Comparative Example 1 was set on a mask stage of an exposure apparatus and exposure-transferred to a resist film on a semiconductor device, a defected area will generate on a circuit pattern to be finally formed on the semiconductor device.

Comparative Example 2

[Manufacture of Mask Blank]

A mask blank of Comparative Example 2 was manufactured by the same process as Example 1, except for the light shielding film 3. A light shielding film of Comparative Example 2 has different film forming condition than the light shielding film 3 of Example 1. Concretely, a transparent substrate 1 having a phase shift film 2 formed thereon was placed in a single-wafer DC sputtering apparatus, and reactive sputtering (DC sputtering) was carried out using a chromium (Cr) target under mixed gas atmosphere of argon (Ar), nitrogen monoxide (NO), and helium (He). Thus, a light shielding film (CrON film) made of chromium, oxygen, and nitrogen was formed at a film thickness of 43 nm in contact with the phase shift film 2.

Next, the transparent substrate having the light shielding film (CrON film) formed thereon was subjected to heat treatment with the same conditions as Example 1. After the heat treatment, a spectrophotometer (Cary4000 manufactured by Agilent Technologies) was used on the transparent substrate having the phase shift film and the light shielding film laminated thereon to measure optical density of the laminated structure of the phase shift film and the light shielding film under ArF excimer laser light wavelength (about 193 nm), and the optical density was 3.0 or more.

Another transparent substrate was prepared, which has only a light shielding film formed on its main surface under the same conditions as above, and which was subjected to heat treatment. The light shielding film was analyzed by an X-ray photoelectron spectroscopy (with XPS, RBS corrections). As a result, it was confirmed that the region near the surface that is opposite of the transparent substrate side of the light shielding film (region up to about 2 nm depth from the surface) has a composition gradient portion having more oxygen content than other regions (40 atom % or more oxygen content). Further, content of each constituent element in the region of the light shielding film excluding the composition gradient portion was found to be, at an average value, Cr: 58 atom %, O: 17 atom %, and N: 25 atom %. Moreover, it was confirmed that the difference of each constituent element in thickness direction of the region of the light shielding film excluding the composition gradient portion is 3 atom % or less, and there is substantially no composition gradient in thickness direction.

Similar to the case of Example 1, result of depth direction chemical bonding condition analysis of Cr2p narrow spectrum, result of depth direction chemical bonding condition analysis of O1s narrow spectrum, result of depth direction chemical bonding condition analysis of N1s narrow spectrum, result of depth direction chemical bonding condition analysis of C1s narrow spectrum, and result of depth direction chemical bonding condition analysis of Si2p narrow spectrum were each obtained also for the light shielding film of Comparative Example 2.

The result of Cr2p narrow spectrum proves that the light shielding film of Comparative Example 2 has a maximum peak at binding energy greater than 574 eV at all depth regions including the uppermost surface. This result can be regarded as a so-called chemical shift, indicating that abundance ratio of chromium atoms that are not bonded to atoms such as nitrogen and oxygen is significantly low. From the result of O1s narrow spectrum, it was found that the light shielding film of Comparative Example 2 has a maximum peak at binding energy of about 530 eV at all depth regions including the uppermost surface. The result indicates that Cr—O bond is present at or more than a certain ratio.

The result of N1s narrow spectrum proves, excluding the uppermost surface, as having a maximum peak at binding energy of about 397 eV. This result indicates that Cr—N bond is present at or more than a certain ratio.

The result of C1s narrow spectrum proves that the light shielding film of Comparative Example 2 has a maximum peak of lower detection limit or less, excluding the uppermost surface. Moreover, since the uppermost surface is significantly subjected to effects of contamination such as organic matters, the measured result on carbon is hardly used as a reference for the uppermost surface. The result indicates that abundance ratio of atoms bonded to carbon, including Cr—C bond, was not detected in the light shielding film of Comparative Example 2.

The result of Si2p narrow spectrum proves that the light shielding film of Comparative Example 2 has a maximum peak of lower detection limit or less at all depth regions. The result indicates that abundance ratio of atoms bonded to silicon, including Cr—Si bond, was not detected in the light shielding film of Comparative Example 2.

[Manufacture of Phase Shift Mask]

Next, a phase shift mask of Comparative Example 2 was manufactured using the mask blank of Comparative Example 2 through the procedure similar to Example 1.

Similar to the case of Example 2, length measurement of space width was carried out in the region where the line-and-space pattern is formed after the hard mask pattern was formed (see FIG. 2(b)) and after the phase shift pattern was formed (see FIG. 2(d)), respectively, using a length measurement SEM (CD-SEM: Critical Dimension-Scanning Electron Microscope). Thereafter, etching bias, which is the change amount between the space width of the hard mask pattern and the space width of the phase shift pattern, was calculated for each of the plurality of locations in the region where the same line-and-space pattern is formed, and further, average value of etching bias was calculated. As a result, average value of etching bias was 25 nm, which was a significantly great value. This indicates that in the case where a light shielding film was patterned through high-bias etching using a hard mask pattern having a fine transfer pattern that should be formed on a phase shift film as an etching mask in the mask blank of Comparative Example 2, it is difficult to form the fine transfer pattern precisely on the light shielding film.

[Evaluation of Pattern Transfer Performance]

On the phase shift mask of Comparative Example 2, a simulation of a transfer image was made when an exposure transfer was made on a resist film on a semiconductor device using AIMS193 (manufactured by Carl Zeiss) at an exposure light of wavelength 193 nm, similar to Example 1. The exposure transfer image of this simulation was verified, and a transfer defect was confirmed. Generation factor of the transfer defect is inferred as poor verticality of the shape caused by large side etching amount in the pattern side wall of the light shielding pattern, and moreover, low in-plane CD uniformity. From this result, it can be considered that when the phase shift mask of Comparative Example 2 was set on a mask stage of an exposure apparatus and exposure-transferred to a resist film on a semiconductor device, a defected area will be generated on a circuit pattern to be finally formed on the semiconductor device.

REFERENCE NUMERALS 1 transparent substrate
2 phase shift film
2a phase shift pattern
3 light shielding film
3a,3b light shielding pattern
4 hard mask film
4a hard mask pattern
5a resist pattern
6b resist pattern
100 mask blank
200 phase shift mask

The invention claimed is:

1. A mask blank comprising:
a transparent substrate;
a phase shift film on the transparent substrate;
a light shielding film on the phase shift film; and
a hard mask film on the light shielding film,
wherein the phase shift film contains silicon, and
wherein the light shielding film is a single layer film having a composition gradient portion with increased oxygen content, and
wherein the light shielding film contains chromium, oxygen, and carbon, and has a first surface that is farthest from the phase shift film in a film thickness direction of the light shielding film, and
wherein the composition gradient portion extends from the first surface of the light shielding film to a depth of less than 5 nm, and the oxygen content of the composition gradient portion varies and is highest at the first surface, and
wherein the light shielding film, excluding the composition gradient portion, has chromium content of 50 atom % or more, and
wherein the light shielding film has a maximum peak of Nls narrow spectrum, obtained by analysis of X-ray photoelectron spectroscopy, of lower detection limit or less, and
wherein the light shielding film, excluding the composition gradient portion, has a maximum peak of Cr2p narrow spectrum, obtained by analysis of X-ray photoelectron spectroscopy, at binding energy of 574 eV or less.

2. The mask blank according to claim 1, wherein ratio of carbon content [atom %] divided by total content [atom %] of chromium, carbon, and oxygen of the light shielding film, excluding the composition gradient portion, is 0.1 or more.

3. The mask blank according to claim 1, wherein the composition gradient portion of the light shielding film has a maximum peak of Cr2p narrow spectrum obtained by analysis of X-ray photoelectron spectroscopy at binding energy of 576 eV or more.

4. The mask blank according to claim 1, wherein the light shielding film has a maximum peak of Si2p narrow spectrum obtained by analysis of X-ray photoelectron spectroscopy of lower detection limit or less.

5. The mask blank according to claim 1, wherein the light shielding film, excluding the composition gradient portion, has chromium content of 80 atom % or less.

6. The mask blank according to claim 1, wherein the light shielding film, excluding the composition gradient portion, has carbon content of at least 10 atom % and not more than 20 atom %.

7. The mask blank according to claim 1, wherein the light shielding film, excluding the composition gradient portion, has oxygen content of at least 10 atom % and not more than 35 atom %.

8. The mask blank according to claim 1, wherein the light shielding film, excluding the composition gradient portion, has difference in content of each constituent element in thickness direction that is less than 10 atom %.

9. The mask blank according to claim 1, wherein an optical density, to ArF excimer laser exposure light, of a layered structure consisting of the phase shift film and the light shielding film is greater than 2.0.

10. The mask blank according to claim 1, wherein the light shielding film has a thickness of 60 nm or less.

11. A method of manufacturing a phase shift mask using the mask blank according to claim 1, comprising:
forming a phase shift pattern on the hard mask film through dry etching using fluorine-based gas with a resist film having a phase shift pattern formed on the hard mask film as a mask;
forming a phase shift pattern on the light shielding film through dry etching using a mixed gas of chlorine-based gas and oxygen gas with the hard mask film having the phase shift pattern formed thereon as a mask;
forming a phase shift pattern on the phase shift film through dry etching using fluorine-based gas with the light shielding film having the phase shift pattern formed thereon as a mask; and
forming a light shielding pattern on the light shielding film through dry etching using a gaseous mixture of chlorine-based gas and oxygen gas with a resist film having the light shielding pattern formed on the light shielding film as a mask.

12. A method of manufacturing a semiconductor device comprising exposure-transferring a transfer pattern on a resist film on a semiconductor substrate, using the phase shift mask manufactured by the method of manufacturing a phase shift mask of claim 11.

13. The method of manufacturing a semiconductor device according to claim 12, wherein the hard mask film contains one or more elements selected from silicon and tantalum.

14. The method of manufacturing a semiconductor device according to claim 12, wherein the oxygen content of the composition gradient portion decreases as distance from the first surface increases.

15. The method of manufacturing a phase shift mask according to claim 11, wherein the hard mask film contains one or more elements selected from silicon and tantalum.

16. The method of manufacturing a phase shift mask according to claim 11, wherein the oxygen content of the composition gradient portion decreases as distance from the first surface increases.

17. The mask blank according to claim 1, wherein a thickness of the light shielding film is greater than 15 nm.

18. The mask blank according to claim 1, the composition gradient portion has oxygen content of 40 atom % or more.

19. The mask blank according to claim 1, wherein the hard mask film contains one or more elements selected from silicon and tantalum.

20. The mask blank according to claim 1, wherein the oxygen content of the composition gradient portion decreases as distance from the first surface increases.

\* \* \* \* \*